(12) United States Patent
Shimizu et al.

(10) Patent No.: US 11,276,774 B2
(45) Date of Patent: Mar. 15, 2022

(54) SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Tatsuo Shimizu, Shinagawa (JP); Toshiyuki Oshima, Bunkyo (JP); Ryosuke Iijima, Setagaya (JP); Hisashi Yoshida, Kawasaki (JP); Shigeya Kimura, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 95 days.

(21) Appl. No.: 16/549,089

(22) Filed: Aug. 23, 2019

(65) Prior Publication Data

US 2020/0220001 A1 Jul. 9, 2020

(30) Foreign Application Priority Data

Jan. 4, 2019 (JP) .............................. JP2019-000058

(51) Int. Cl.
*H01L 29/778* (2006.01)
*H01L 29/16* (2006.01)
(Continued)

(52) U.S. Cl.
CPC .......... *H01L 29/7786* (2013.01); *B60L 50/51* (2019.02); *B66B 11/043* (2013.01);
(Continued)

(58) Field of Classification Search
CPC ............. H01L 29/7786; H01L 29/1608; H01L 29/518; H01L 29/4236; H01L 29/517;
(Continued)

(56) References Cited

U.S. PATENT DOCUMENTS 5,977,564 A * 11/1999 Kobayashi ............ H01L 29/045
257/77
9,312,350 B2 4/2016 Minoura et al.
(Continued)

FOREIGN PATENT DOCUMENTS

JP 2000-106428 A 4/2000
JP 2000-150875 A 5/2000
(Continued)

OTHER PUBLICATIONS

Tega, N, et al., "Robustness improvement of short-circuit capability by SiC trench-etched double-diffused MOS (TED MOS)", Proceedings of the 30th International Symposium on Power Semiconductor Devices & ICs, IEEE, 2018, pp. 439-442.

*Primary Examiner* — Mouloucoulaye Inoussa
(74) *Attorney, Agent, or Firm* — Oblon, McClelland, Maier & Neustadt, L.L.P.

(57) ABSTRACT

An embodiment of a semiconductor device including a silicon carbide layer having a first and a second planes; a first silicon carbide region of first conductivity type in the silicon carbide layer; a second silicon carbide region of second conductivity type in the silicon carbide layer between the first silicon carbide region and the first plane; a third silicon carbide region of the first conductivity type in the silicon carbide layer located between the second silicon carbide region and the first plane; a first electrode located on a side of the first plane; a second electrode located on a side of the second plane; a gate electrode; an aluminum nitride layer containing an aluminum nitride crystal between the second silicon carbide region and the gate electrode; and an insulating layer between the aluminum nitride layer and the gate electrode and having a wider band gap than the aluminum nitride layer.

12 Claims, 14 Drawing Sheets

(51) Int. Cl.
  *H01L 29/51*    (2006.01)
  *H01L 29/423*   (2006.01)
  *B60L 50/51*    (2019.01)
  *B66B 11/04*    (2006.01)
  *H02M 7/537*    (2006.01)
  *H02P 27/06*    (2006.01)

(52) U.S. Cl.
  CPC ...... *H01L 29/1608* (2013.01); *H01L 29/4236* (2013.01); *H01L 29/518* (2013.01); *H02M 7/537* (2013.01); *B60L 2200/26* (2013.01); *H02P 27/06* (2013.01)

(58) Field of Classification Search
  CPC . H01L 29/1095; H01L 29/408; H01L 29/267; H01L 29/0878; H01L 29/0623; H01L 29/513; H01L 29/045; H01L 29/086; H01L 29/51; H01L 29/7802; H01L 29/66068; H01L 29/78684; H01L 29/167; H01L 29/4925; H01L 29/7813; H01L 29/4916; H01L 29/94; H01L 21/049; H01L 29/6606; H01L 21/8213; H01L 29/66674; H01L 29/0696; H01L 29/0634; H01L 29/7395; H02M 7/537; H02M 7/538; H02M 7/5387; B60L 50/51; B66B 11/043; H02P 27/06; Y02T 10/70
  USPC ............ 257/66, 192, 49, 77, 628, 18, 22, 76
  See application file for complete search history.

(56) References Cited

U.S. PATENT DOCUMENTS

| | | | |
|---|---|---|---|
| 2006/0194379 A1* | 8/2006 | Suda | H01L 29/511 438/197 |
| 2006/0255363 A1* | 11/2006 | Shibata | H01L 21/02458 257/190 |
| 2010/0072485 A1 | 3/2010 | Suda et al. | |
| 2011/0017998 A1* | 1/2011 | Nakano | H01L 29/66068 257/66 |
| 2014/0191247 A1* | 7/2014 | Iijima | H01L 29/0657 257/77 |
| 2015/0357415 A1* | 12/2015 | Kagawa | H01L 29/0623 257/77 |
| 2016/0007941 A1 | 3/2016 | Yasumoto et al. | |
| 2016/0087044 A1* | 3/2016 | Iijima | H01L 29/7802 257/77 |
| 2016/0087064 A1* | 3/2016 | Ohashi | H01L 29/42364 257/77 |
| 2016/0190234 A1* | 6/2016 | Iijima | H01L 29/7835 257/77 |
| 2019/0229191 A1* | 7/2019 | Noguchi | H01L 29/12 |
| 2019/0348531 A1 | 11/2019 | Kimura et al. | |

FOREIGN PATENT DOCUMENTS

| | | |
|---|---|---|
| JP | WO2005/010974 A1 | 2/2005 |
| JP | WO2008/123213 A1 | 10/2008 |
| JP | 2012-169385 A | 9/2012 |
| JP | 2012-169470 A | 9/2012 |
| JP | 2013-026593 A | 2/2013 |
| JP | 2014-229838 A | 12/2014 |
| JP | 2015-032674 A | 2/2015 |
| JP | 2016-058648 A | 4/2016 |
| JP | 2016-127073 A | 7/2016 |
| JP | 2017-216305 A | 12/2017 |
| JP | 2018-046247 A | 3/2018 |
| JP | 2019-134164 A | 8/2019 |
| JP | 2019-201035 A | 11/2019 |
| WO | WO 2005/010974 A1 | 2/2005 |
| WO | WO 2008/123213 A1 | 10/2008 |
| WO | 2011/027831 A1 | 3/2011 |

* cited by examiner

US 11,276,774 B2

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2019-000058, filed on Jan. 4, 2019, the entire contents of which are incorporated herein by reference.

FIELD

Embodiments described herein relate generally to semiconductor devices, inverter circuits, driving devices, vehicles, and elevators.

BACKGROUND

Silicon carbide (SiC) is expected as a material for the next generation of semiconductor devices. The silicon carbide has excellent physical properties such as a band gap of about 3 times, a breakdown field strength of about 10 times, and a thermal conductivity of about 3 times compared to silicon (Si). By utilizing these properties, a semiconductor device capable of being low loss and performing high temperature operation can be realized.

However, for example, in a case of forming a metal oxide semiconductor field effect transistor (MOSFET) by using the silicon carbide, there is a problem in that it is difficult to reduce on-resistance. One factor that reduces the on-resistance is considered to be an interface state present at an interface between a silicon carbide layer and a gate insulating layer.

DETAILED DESCRIPTION

Figure 1:
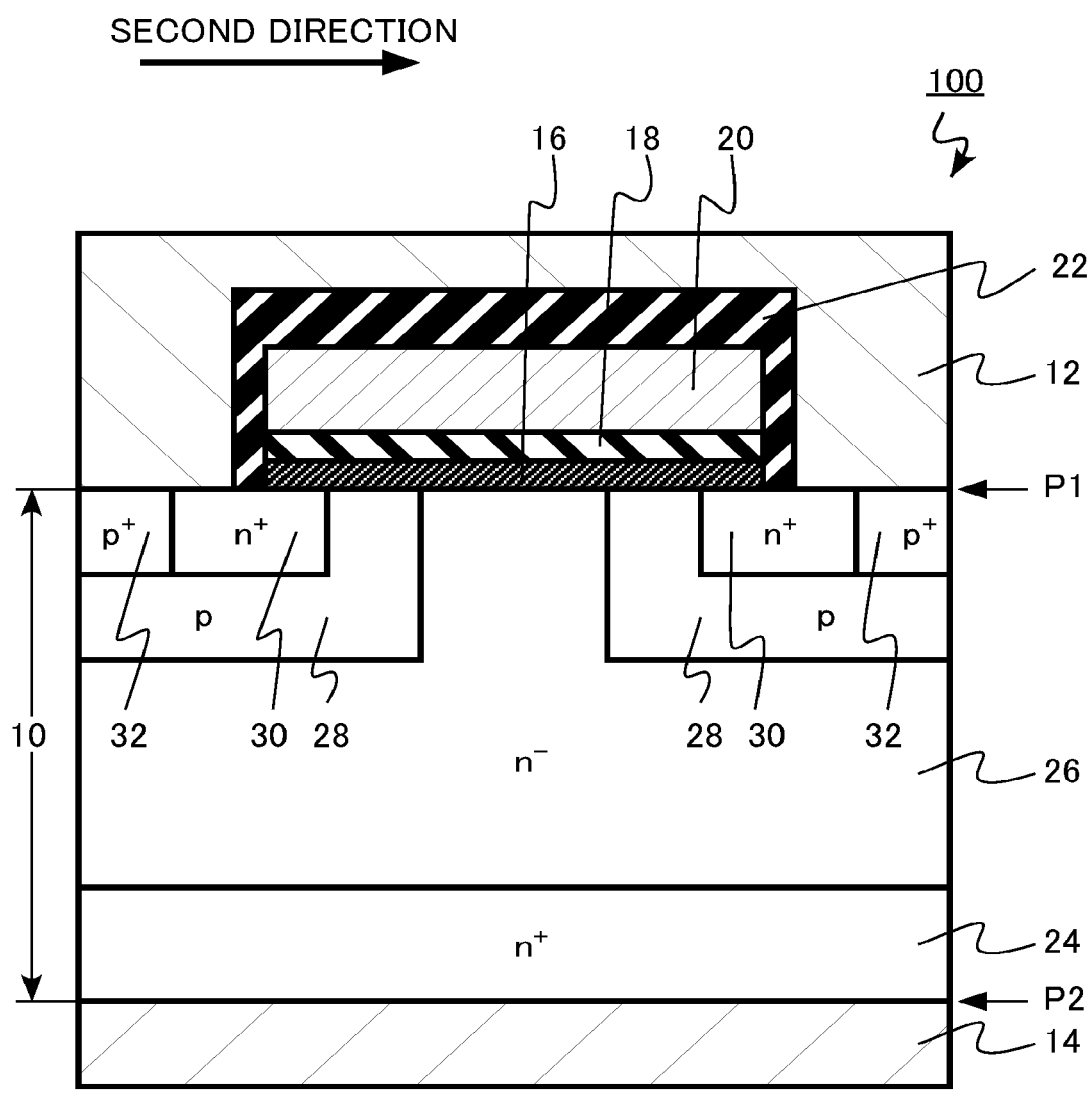
FIG. 1 is a schematic cross-sectional view of a semiconductor device according to a first embodiment.

A semiconductor device according to an embodiment includes: a silicon carbide layer having a first plane and a second plane facing the first plane; a first silicon carbide region of a first conductivity type existing in the silicon carbide layer; a second silicon carbide region of a second conductivity type existing in the silicon carbide layer and being located between the first silicon carbide region and the first plane; a third silicon carbide region of the first conductivity type existing in the silicon carbide layer and being located between the second silicon carbide region and the first plane; a first electrode located on a side of the silicon carbide layer closer to the first plane; a second electrode located on a side of the silicon carbide layer closer to the second plane; a gate electrode; an aluminum nitride layer located between the second silicon carbide region and the gate electrode, the aluminum nitride layer containing an aluminum nitride crystal; and an insulating layer located between the aluminum nitride layer and the gate electrode and having a wider band gap than the aluminum nitride layer.

Hereinafter, embodiments will be described with reference to the drawings. In the following description, the same or similar members are denoted by the same reference numerals, and the description of the members or the like that have been described once is omitted as appropriate.

In addition, in the following description, the expressions $n^+$, $n$, $n^-$ and $p^+$, $p$, $p^-$ indicate the relative heights of the impurity concentrations in the respective conductivity types. That is, it is indicated that $n^+$ is relatively higher in the n-type impurity concentration than n, and $n^-$ is relatively lower in the n-type impurity concentration than n. In addition, it is indicated that $p^+$ is relatively higher in the p-type impurity concentration than p, and $p^-$ is relatively lower in the p-type impurity concentration than p. In addition, in some cases, the $n^+$-type and the $n^-$-type may be simply described as the n-type, and the $p^+$-type and the $p^-$-type may be simply described as the p-type. The impurity concentration in each region is represented, for example, by the value of the impurity concentration in the central portion of each region, unless otherwise specified.

First Embodiment

A semiconductor device according to a first embodiment includes: a silicon carbide layer having a first plane and a second plane facing the first plane; a first silicon carbide region of a first conductivity type existing in the silicon carbide layer; a second silicon carbide region of a second conductivity type existing in the silicon carbide layer and being located between the first silicon carbide region and the first plane; a third silicon carbide region of the first conductivity type existing in the silicon carbide layer and being located between the second silicon carbide region and the first plane; a first electrode located on a side of the silicon carbide layer closer to the first plane; a second electrode located on a side of the silicon carbide layer closer to the second plane; a gate electrode; an aluminum nitride layer located between the second silicon carbide region and the gate electrode, the aluminum nitride layer containing an aluminum nitride crystal; and an insulating layer located between the aluminum nitride layer and the gate electrode and having a wider band gap than the aluminum nitride layer.

Hereinafter, a case where the first conductivity type is n-type and the second conductivity type is p-type will be described as an example.

FIG. 1 is a schematic cross-sectional view of the semiconductor device according to the first embodiment. The semiconductor device according to the first embodiment is a vertical transistor 100. The vertical transistor 100 is a transistor having electrons as carriers.

Figure 2:
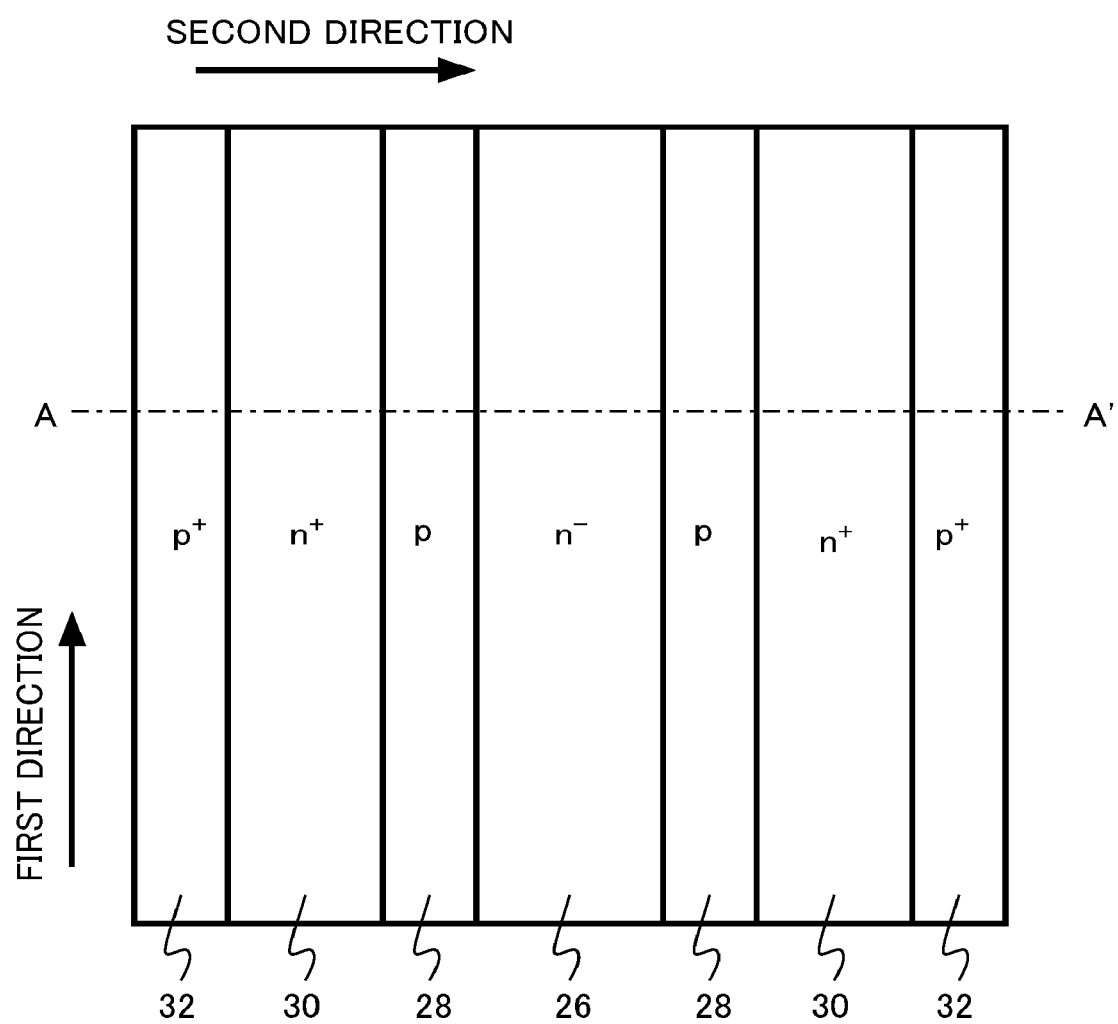
FIG. 2 is a schematic top view of the semiconductor device according to the first embodiment.

FIG. 2 is a schematic top view of the semiconductor device according to the first embodiment. FIG. 2 is a view illustrating a first plane of a silicon carbide layer 10. FIG. 1 is a cross-sectional view taken along line AA' of FIG. 2.

The vertical transistor 100 includes a silicon carbide layer 10, a source electrode 12 (first electrode), a drain electrode 14 (second electrode), an aluminum nitride layer 16, a gate insulating layer 18 (insulating layer), a gate electrode 20, and an interlayer insulating layer 22.

A drain region 24, a drift region 26 (first silicon carbide region), a p-well region 28 (second silicon carbide region), a source region 30 (third silicon carbide region), and a p-well contact region 32 exist in the silicon carbide layer 10.

Figure 3:
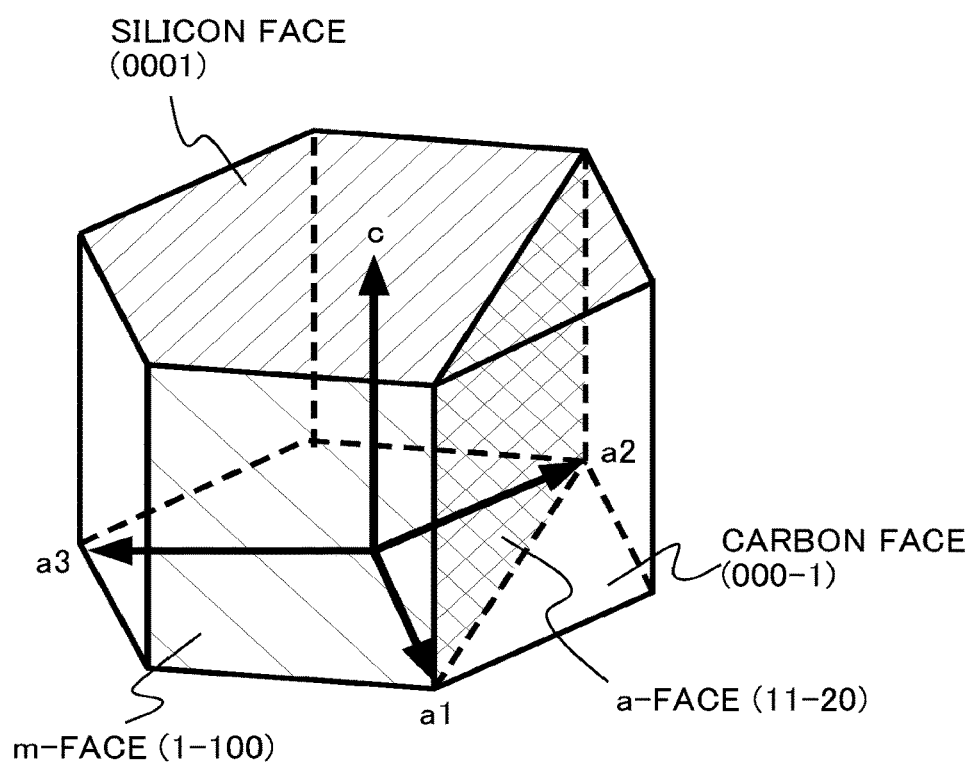
FIG. 3 is a diagram illustrating a crystal structure of a SiC semiconductor.

FIG. 3 is a view illustrating a crystal structure of a SiC semiconductor. A representative crystal structure of the SiC semiconductor is a hexagonal crystal system such as 4H—SiC.

In the SiC semiconductor having a hexagonal crystal system, one of faces (top faces of a hexagonal column) having the c-axis along the axial direction of the hexagonal column as a normal is a (0001) face. The (0001) face is referred to as a silicon face. Silicon atoms (Si) are arranged on the outermost face of the silicon face.

The silicon atoms (Si) on the outermost face of the silicon face are positively charged. The silicon face is a polar surface.

The other of the faces (top faces of the hexagonal column) having the c axis along the axial direction of the hexagonal column as a normal is the (000-1) face. The (000-1) face is called a carbon face. Carbon atoms (C) are arranged on the outermost face of the carbon face.

The carbon atom (C) on the outermost face of the carbon face is negatively charged. The carbon face is a polar surface.

A side face (column face) of the hexagonal column is an m-face, that is, a {1-100} face, which is a face equivalent to the (1-100) face. In addition, a face passing through a pair of ridges not adjacent to each other is an a-face, that is, a {11-20} face, which is a face equivalent to the (11-20) face. On the outermost face of the m-face and the a-face, both silicon atoms (Si) and carbon atoms (C) are arranged. The m-face and the a-face are nonpolar faces.

The silicon carbide layer 10 is, for example, a single crystal of 4H—SiC. The silicon carbide layer 10 has a first plane P1 and a second plane P2. The second plane P2 faces the first plane P1. The first plane P1 is the front surface of the silicon carbide layer 10, and the second plane P2 is the back surface of the silicon carbide layer 10.

Hereinafter, a case where the first plane P1 of the silicon carbide layer 10 is a plane inclined at 0 degrees to 10 degrees with respect to the silicon face and the second plane P2 is a plane inclined at 0 degrees to 10 degrees with respect to the carbon face will be described as an example. The first plane P1 of the silicon carbide layer 10 has an off angle of 0 degrees or more and 10 degrees or less with respect to the silicon face.

The characteristics of the plane inclined at 0 degrees or more and 10 degrees or less with respect to the silicon face can be regarded as substantially equal to the silicon face. In addition, a plane inclined at 0 degrees to 10 degrees with respect to the carbon face can be considered to be substantially the same as the carbon face.

The drain region 24 is an n$^+$-type SiC. The drain region 24 contains, for example, nitrogen (N) as n-type impurities. The n-type impurity concentration of the drain region 24 is, for example, $1 \times 10^{18}$ cm$^{-3}$ or more and $1 \times 10^{21}$ cm$^{-3}$ or less.

The drift region 26 is an n$^-$-type SiC. The drift region 26 is located between the drain region 24 and the first plane P1. A portion of the drift region 26 is in contact with the first plane P1.

The drift region 26 contains, for example, nitrogen (N) as n-type impurities. The n-type impurity concentration of the drift region 26 is, for example, $1 \times 10^{15}$ cm$^{-3}$ or more and $2 \times 10^{16}$ cm$^{-3}$ or less. The n-type impurity concentration of the drift region 26 is lower than the n-type impurity concentration of the drain region 24.

The drift region 26 is, for example, an epitaxial growth layer of SiC formed epitaxially on the drain region 24. The thickness of the drift region 26 is, for example, 5 µm or more and 100 µm or less.

The p-well region 28 is a p-type SiC. The p-well region 28 is located between the drift region 26 and the first plane P1. A portion of the p-well region 28 is in contact with the first plane P1. The p-well region 28 extends in the first direction.

The p-well region 28 contains, for example, aluminum (Al) as p-type impurities. The p-type impurity concentration of the p-well region 28 is, for example, $1 \times 10^{16}$ cm$^{-3}$ or more and $1 \times 10^{20}$ cm$^{-3}$ or less. The p-type impurity concentration of the p-well region 28 is, for example, $5 \times 10^{10}$ cm$^{-3}$ or more.

The depth of the p-well region 28 is, for example, 0.4 µm or more and 0.8 µm or less. The p-well region 28 functions as a channel region of the vertical transistor 100.

The source region 30 is an n$^+$-type SiC. The source region 30 is located between the p-well region 28 and the first plane P1. A portion of the source region 30 is in contact with the first plane P1. The source region 30 extends in the first direction.

The source region 30 contains, for example, phosphorus (P) as n-type impurities. The n-type impurity concentration of the source region 30 is, for example, $1 \times 10^{18}$ cm$^{-3}$ or more and $1 \times 10^{22}$ cm$^{-3}$ or less. The n-type impurity concentration of the source region 30 is higher than the n-type impurity concentration of the drift region 26.

The depth of the source region 30 is smaller than the depth of the p-well region 28. The depth of the source region 30 is, for example, 0.2 µm or more and 0.4 µm or less.

The p-well contact region 32 is a p$^+$-type SiC. The p-well contact region 32 is located between the p-well region 28 and the first plane P1. A portion of the p-well contact region 32 is in contact with the first plane P1. The p-well contact region 32 is adjacent to the source region 30. The p-well contact region 32 extends in the first direction.

The p-well contact region 32 contains, for example, aluminum as p-type impurities. The p-type impurity concentration of the p-well contact region 32 is, for example, $1 \times 10^{28}$ cm$^{-3}$ or more and $1 \times 10^{22}$ cm$^{-3}$ or less. The p-type impurity concentration of the p-well contact region 32 is higher than the p-type impurity concentration of the p-well region 28.

The depth of the p-well contact region 32 is smaller than the depth of the p-well region 28. The depth of the p-well contact region 32 is, for example, 0.2 μm or more and 0.4 μm or less.

The aluminum nitride layer 16 is located between the silicon carbide layer 10 and the gate electrode 20. The aluminum nitride layer 16 is located between the p-well region 28 and the gate electrode 20. The aluminum nitride layer 16 is located between the p-well region 28 and the gate insulating layer 18.

The aluminum nitride layer 16 and the p-well region 28 are in contact with each other. The p-well region 28 in the vicinity of the aluminum nitride layer 16 becomes the channel region of the vertical transistor 100.

The aluminum nitride layer 16 contains aluminum nitride crystals. The aluminum nitride layer 16 is crystalline. The aluminum nitride layer 16 is a single crystal or a polycrystal.

Figure 4:
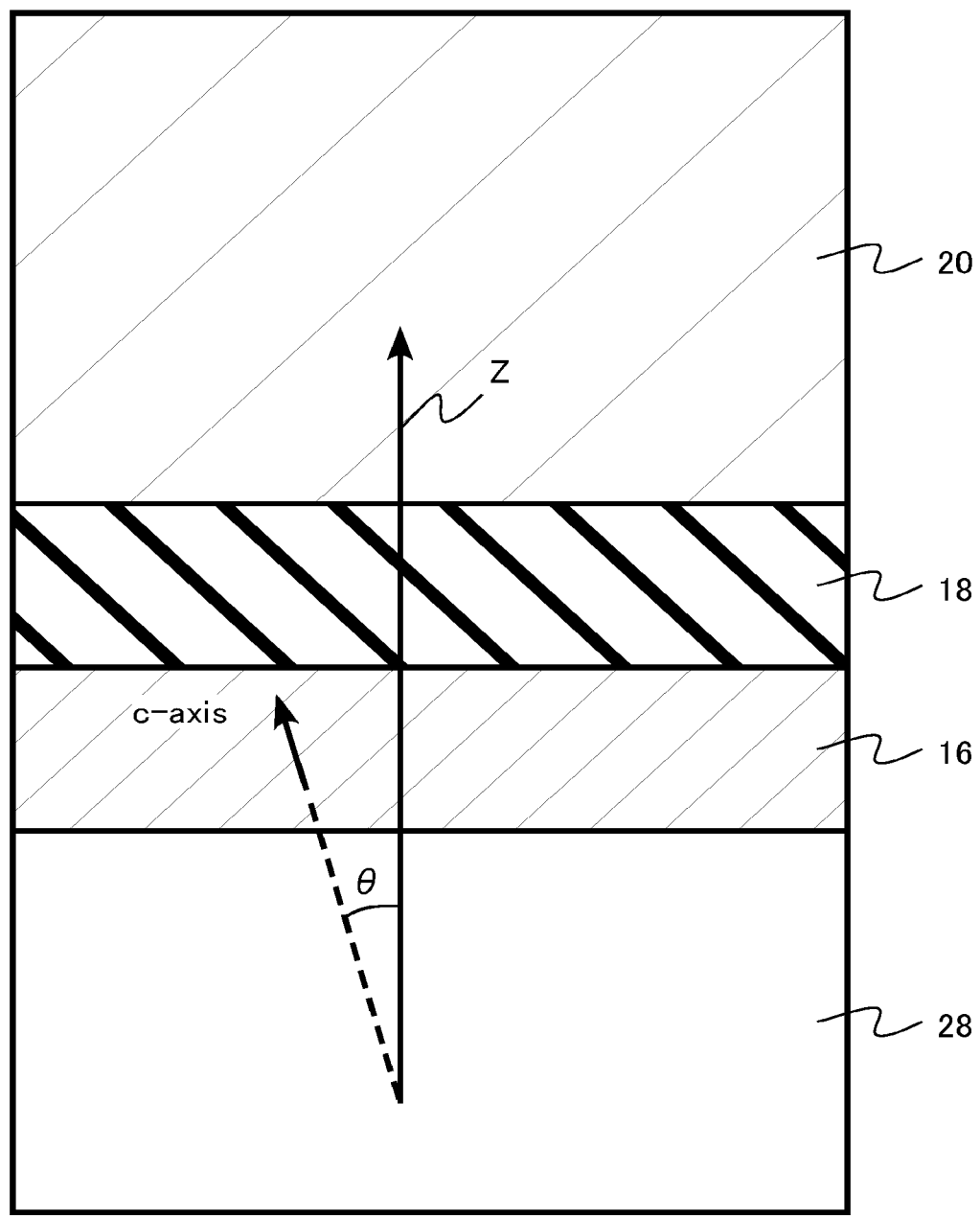
FIG. 4 is an explanatory view of an aluminum nitride layer of the semiconductor device according to the first embodiment.

FIG. 4 is an explanatory view of the aluminum nitride layer of the semiconductor device according to the first embodiment. FIG. 4 is an enlarged cross-sectional view of a portion of the p-well region 28, the aluminum nitride layer 16, the gate insulating layer 18, and the gate electrode 20.

The angle (θ in FIG. 4) between the c-axis direction of the aluminum nitride crystal contained in the aluminum nitride layer 16 and the direction (Z in FIG. 4) from the p-well region 28 toward the gate electrode 20 is less than 90 degrees. In other words, the angle between the c-axis direction of the aluminum nitride crystal contained in the aluminum nitride layer 16 and the direction toward the gate electrode 20 normal to the surface of the p-well region 28 being in contact with the aluminum nitride layer 16 is less than 90 degrees.

The aluminum nitride layer 16 is formed so that the c-axis direction of the aluminum nitride crystal is aligned with the c-axis direction of the silicon carbide layer 10. The angle θ between the c-axis direction of the aluminum nitride crystal contained in the aluminum nitride layer 16 and the direction from the p-well region 28 toward the gate electrode 20 is, for example, 45 degrees or less.

In a case where the aluminum nitride layer 16 is polycrystalline, for example, the aluminum nitride layer 16 is formed so that the average of the c-axis directions of the plurality of aluminum nitride crystals contained in the aluminum nitride layer 16 is aligned with the c-axis direction of the silicon carbide layer 10. The angle θ between the average of the c-axis directions of the plurality of aluminum nitride crystals contained in the aluminum nitride layer 16 and the direction from the p-well region 28 toward the gate electrode 20 is, for example, 45 degrees or less.

The thickness of the aluminum nitride layer 16 is, for example, larger than 10 nm and equal to or smaller than 60 nm. The thickness of the aluminum nitride layer 16 is, for example, larger than 30 nm.

The aluminum nitride layer 16 has fixed polarization in which the side closer to the gate electrode 20 is negative and the side closer to the silicon carbide layer 10 is positive. The fixed polarization of the aluminum nitride layer 16 is a sum of the spontaneous polarization of the aluminum nitride and the piezoelectric polarization due to the distortion in the aluminum nitride layer 16. Since the aluminum nitride layer 16 has fixed polarization, negative fixed charges are formed on the side closer to the gate electrode 20 and positive fixed charges are formed on the side closer to the silicon carbide layer 10.

The gate insulating layer 18 is located between the aluminum nitride layer 16 and the gate electrode 20. The gate insulating layer 18 has a wider band gap than the aluminum nitride layer 16.

The gate insulating layer 18 is, for example, an oxide or an oxynitride. The gate insulating layer 18 is, for example, a silicon oxide. The silicon oxide equivalent thickness of the gate insulating layer 18 is, for example, larger than 10 nm and equal to or smaller than 50 nm. The gate insulating layer 18 may be, for example, an aluminum oxide, an aluminum oxynitride, or a silicon oxynitride. The gate insulating layer 18 may have, for example, a stacked structure in which two or more layers of an aluminum oxide, an aluminum oxynitride, a silicon oxide, a silicon oxynitride, or the like are stacked. The gate insulating layer 18 is in an amorphous state.

The gate electrode 20 is provided on the gate insulating layer 18. The gate electrode 20 interposes the aluminum nitride layer 16 and the gate insulating layer 18 between the drift region 26, the source region 30, and the p-well region 28 and the gate electrode 20.

The gate electrode 20 is a conductor. The gate electrode 20 is, for example, polycrystalline silicon containing n-type impurities or p-type impurities. The gate electrode 20 may be a stacked structure containing, for example, a metal such as a titanium nitride, a tungsten nitride, tungsten, aluminum, copper, ruthenium, cobalt, nickel, a cobalt silicide or a nickel silicide, or polycrystalline silicon containing these metals and n-type impurities or p-type impurities.

The interlayer insulating layer 22 is formed on the gate electrode 20. The interlayer insulating layer 22 is, for example, a silicon oxide.

The source electrode 12 is located on the side of the silicon carbide layer 10 closer to the first plane P1. The source electrode 12 is in contact with the source region 30 and the p-well contact region 32. The source electrode 12 is electrically connected to the source region 30 and the p-well contact region 32. The source electrode 12 also functions as a p-well electrode for applying a potential to the p-well region 28.

The source electrode 12 is configured as a stacked layer of, for example, a barrier metal layer of nickel (Ni) and a metal layer of aluminum on the barrier metal layer. The barrier metal layer of nickel and the silicon carbide layer 10 may react with each other to form a nickel silicide. The nickel silicide is, for example, NiSi or $Ni_2Si$. The barrier metal layer of nickel and the metal layer of aluminum may react with each other to form an alloy.

The drain electrode 14 is located on the side of the silicon carbide layer 10 closer to the second plane P2. The drain electrode 14 is in contact with the drain region 24. The drain electrode 14 is electrically connected to the drain region 24.

The drain electrode 14 is, for example, nickel. The nickel may react with the silicon carbide layer 10 to form a nickel silicide. The nickel silicide is, for example, NiSi or $Ni_2Si$.

In the semiconductor device according to the first embodiment, the n-type impurity is, for example, nitrogen or phosphorus. It is also possible to employ arsenic (As) or antimony (Sb) as n-type impurities.

In the semiconductor device according to the first embodiment, the p-type impurity is, for example, aluminum. It is also possible to employ boron (B), gallium (Ga), or indium (In) as p-type impurities.

The impurity concentration in the silicon carbide layer 10 can be measured by, for example, secondary ion mass spectrometry (SIMS). In addition, the conductivity types of the impurities and the magnitude relationship of the impurity concentrations in the silicon carbide layer 10 can be measured by, for example, scanning capacitance microscopy (SCM).

The c-axis direction of the silicon carbide layer 10 and the c-axis direction of the aluminum nitride crystal contained in aluminum nitride layer 16 can be determined, for example, by observation with a high resolution transmission electron microscope (TEM).

Next, a method of manufacturing the semiconductor device according to the first embodiment will be described.

Figure 5:
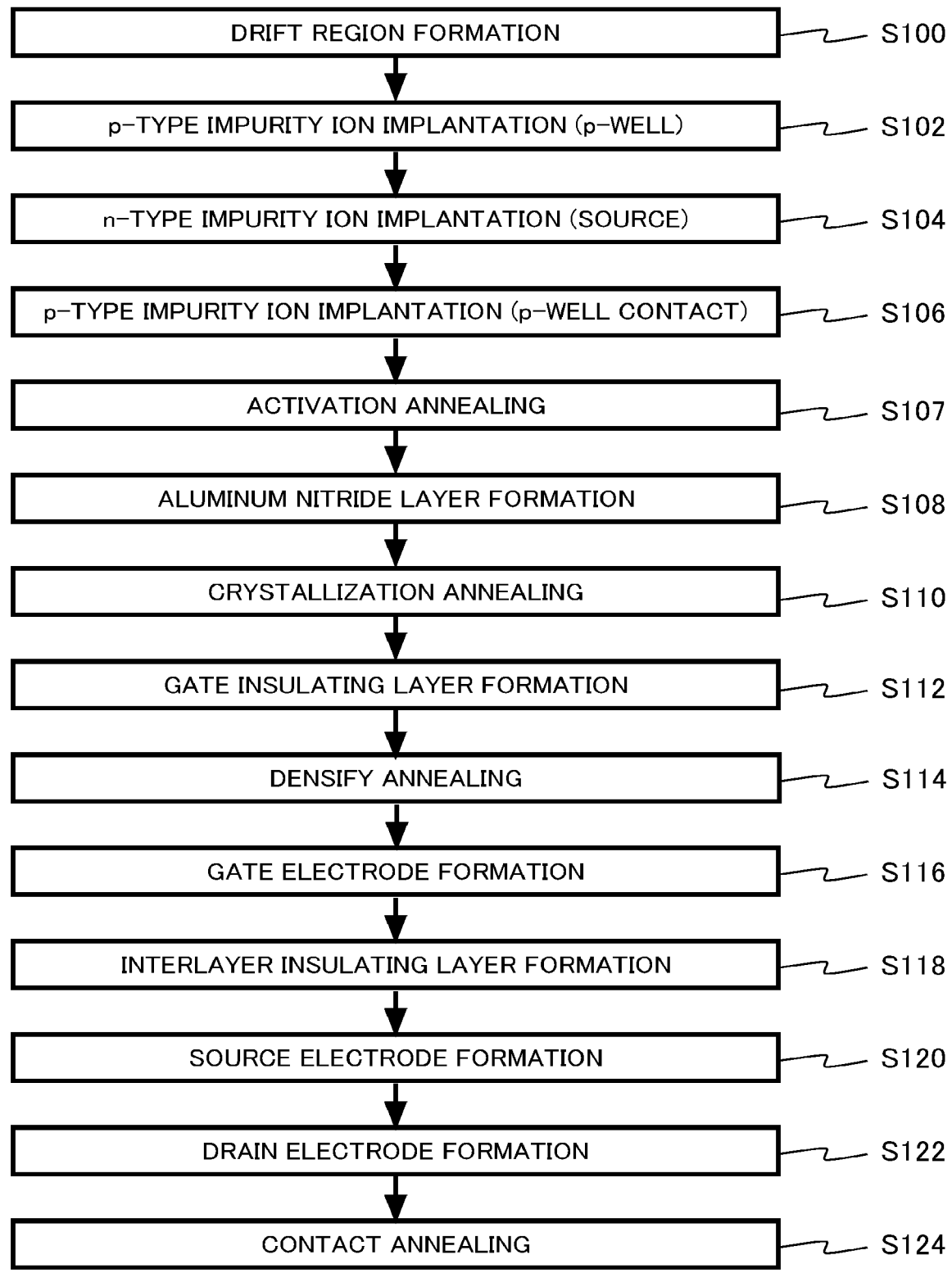
FIG. 5 is a process flowchart of a method of manufacturing the semiconductor device according to the first embodiment.

FIG. 5 is a process flowchart of a method of manufacturing the semiconductor device according to the first embodiment.

As illustrated in FIG. 5, the method of manufacturing the semiconductor device according to the first embodiment includes a drift region formation step S100, a p-type impurity ion implantation step S102, an n-type impurity ion implantation step S104, a p-type impurity ion implantation step S106, an activation annealing step S107, an aluminum nitride layer formation step S108, a crystallization annealing step S110, a gate insulating layer formation step S112, a densify annealing step S114, a gate electrode formation step S116, an interlayer insulating layer formation step S118, a source electrode formation step S120, a drain electrode formation step S122, and a contact annealing step S124.

First, an $n^+$-type silicon carbide substrate is prepared. The silicon carbide substrate corresponds to the drain region 24. The silicon carbide substrate is, for example, 4H—SiC. The silicon carbide substrate is, for example, a silicon carbide wafer.

The silicon carbide substrate contains nitrogen as n-type impurities. The thickness of the silicon carbide substrate is, for example, 350 μm. The silicon carbide substrate may be thinned to about 90 μm before the drain electrode 14 on the back surface is formed.

In the drift region formation step S100, the drift region 26 is formed on a silicon face of the silicon carbide substrate by an epitaxial growth method. The drift region 26 is 4H—SiC. The drift region 26 contains nitrogen as an n-type impurity.

In the p-type impurity ion implantation step S102, first, a first mask material is formed by patterning by photolithography and etching. Then, by using the first mask material as an ion implantation mask, aluminum ions as p-type impurities are implanted into the drift region 26. The p-well region 28 is formed by the ion implantation.

In the n-type impurity ion implantation step S104, first, a second mask material is formed by patterning by photolithography and etching. Then, by using the second mask material as an ion implantation mask, nitrogen ions as n-type impurities are implanted into the drift region 26 to form the source region 30.

In the p-type impurity ion implantation step S106, a third mask material is formed by patterning by photolithography and etching. By using the third mask material as an ion implantation mask, aluminum ions as p-type impurities are implanted into the drift region 26, so that the p-well contact region 32 is formed.

In the activation annealing step S107, the p-type impurities and the n-type impurities introduced into the silicon carbide layer 10 by ion implantation are activated by heat treatment. The heat treatment is performed, for example, at a temperature of 1600° C. or more and 1900° C. or less in a non-oxidizing atmosphere. The non-oxidizing atmosphere is, for example, an argon atmosphere. Before the heat treatment, for example, a carbon cap layer covering the front surface of the silicon carbide layer 10 is formed.

In the aluminum nitride layer formation step S108, the aluminum nitride layer 16 is formed on the silicon carbide layer 10. The aluminum nitride layer 16 is formed by, for example, an Atomic layer deposition (ALD) method or a Chemical vapor deposition (CVD) method.

In the crystallization annealing step S110, first heat treatment is performed. The first heat treatment crystallizes the aluminum nitride layer 16. The aluminum nitride layer 16 is a single crystal or a polycrystal. The aluminum nitride layer 16 formed on the silicon face is a single crystal in which the aluminum face is directed to the front surface or a polycrystal in which the aluminum face is oriented in the direction to be directed toward the upper surface.

The temperature of the first heat treatment is, for example, 900° C. or more. In addition, for example, the atmosphere of the first heat treatment contains hydrogen. The first heat treatment is performed, for example, in a 100% hydrogen gas atmosphere. The first heat treatment is performed, for example, in a mixed gas atmosphere of hydrogen gas and nitrogen gas, a mixed gas atmosphere of hydrogen gas and argon gas, or a mixed gas atmosphere of hydrogen gas and helium gas.

By performing the heat treatment in an atmosphere containing hydrogen, the occurrence of misfit dislocations caused by lattice mismatch at the interface between silicon carbide layer 10 and aluminum nitride layer 16 is suppressed. This is because hydrogen acts on the bond at the interface between the silicon carbide layer 10 and the aluminum nitride layer 16, so that the bond replacement at the interface easily proceeds.

By performing the annealing in an atmosphere containing a sufficient amount of hydrogen, it is possible to reduce the misfit dislocations to, for example, 1/100 times or less in comparison to the case of an atmosphere containing no hydrogen. By sliding the interface between the silicon carbide layer 10 and the aluminum nitride layer 16, a thick aluminum nitride layer 16 with high crystallinity can be obtained. Therefore, the interface state of the interface between the aluminum nitride layer 16 and the silicon carbide layer 10 having a thickness of, for example, more than 10 nm is suppressed.

The lattice constant of the aluminum nitride is larger by about 1% than the lattice constant of the silicon carbide. For this reason, in the epitaxial growth in which the lattice constant is maintained, the fixed polarization of the aluminum nitride layer is reduced by the piezoelectric polarization. By sliding the interface between the silicon carbide layer 10 and the aluminum nitride layer 16, the piezoelectric polarization is reduced, so that it is possible to generate the fixed polarization approximate to the spontaneous polarization of the aluminum nitride. For this reason, the density of the two-dimensional electron gas (2DEG) to be expressed can be increased.

In order for the hydrogen to cause bond replacement at the interface between the silicon carbide layer 10 and the aluminum nitride layer 16, hydrogen atoms need to break the bond. That is, it is important to supply atomic hydrogen at the time of film formation of the aluminum nitride layer 16. Molecular $H_2$ requires a large amount of energy of approximately 5 eV in order to decompose $H_2$. By supplying atomic hydrogen at the time of film formation of the aluminum nitride layer 16, the occurrence of misfit dislocations can be further suppressed in comparison to the supply of $H_2$.

The supply of atomic hydrogen is performed, for example, by a heating catalyst method. The heating catalyst method is a method of generating atomic elements that cause thermal dissociation by metal filaments for thermal dissociation. By the heating catalyst method, hydrogen molecules and deuterium molecules can be dissociated into hydrogen atoms and deuterium atoms, respectively. The metal filament is made of, for example, tungsten, molybdenum, iron chromium, rhenium, or thorium.

The angle (θ in FIG. 4) between the c-axis direction of the aluminum nitride crystal contained in the aluminum nitride layer 16 and the direction (Z in FIG. 4) from the p-well region 28 toward the gate electrode 20 is less than 90 degrees. In other words, the aluminum nitride layer 16 is formed so that the c-axis direction of the aluminum nitride crystal is aligned with the c-axis direction of the silicon carbide layer 10.

The first plane of the silicon carbide layer 10 is a polar face. The positively charged silicon atoms are arranged on the first plane of the silicon carbide layer 10. The growth of the aluminum nitride crystal is affected by the charged state of the first plane. Since the silicon atoms are positively charged, at the time of forming the aluminum nitride layer, nitrogen atoms being negatively charged are likely to exist on the front surface of the silicon carbide layer 10.

For this reason, the aluminum nitride layer 16 is formed so that the side closer to the gate electrode 20 is aluminum and the side closer to the silicon carbide layer 10 is nitrogen. Since nitrogen of the negative charge on the electrode side and aluminum of the positive charge coupled in the c-axis direction become the main components of the polarization, the aluminum nitride layer 16 is formed so as to have a spontaneous polarization in which the side closer to the gate electrode 20 is negative and the side closer to the silicon carbide layer 10 is positive. At this time, the aluminum nitride layer 16 is formed so that the c-axis direction of the aluminum nitride crystal is aligned with the c-axis direction of the silicon carbide layer 10.

In the gate insulating layer formation step S112, the gate insulating layer 18 is formed on the aluminum nitride layer 16. The gate insulating layer 18 is formed by, for example, a CVD method or a physical vapor deposition (PVD) method. The gate insulating layer 18 is, for example, a silicon oxide.

In the densify annealing step S114, second heat treatment is performed. The gate insulating layer 18 is densified by the second heat treatment. The second heat treatment is performed, for example, in a non-oxidative atmosphere. The second heat treatment is performed, for example, in a nitrogen atmosphere. The second heat treatment is annealing using a nitrogen gas. Also, in the case of the densify annealing, it is possible to reduce interface traps of the aluminum nitride (AlN)/insulating film by introducing hydrogen. In the related art, charge trapping occurs at the interface of the aluminum nitride (AlN)/silicon oxide ($SiO_2$) and the like. However, bond replacement can be performed by hydrogen, and thus, charge trapping in a wrong manner can be suppressed. Also, herein, since the dissociative energy is unnecessary, it is more effective to use atomic hydrogen than molecular hydrogen.

In the gate electrode formation step S116, the gate electrode 20 is formed on the gate insulating layer 18 by using a known process technology. The gate electrode 20 is, for example, polycrystalline silicon containing n-type impurities or p-type impurities.

In the interlayer insulating layer formation step S118, the interlayer insulating layer 22 is formed on the gate electrode 20 by using a known process technology. The interlayer insulating layer 22 is, for example, a silicon oxide.

In the source electrode formation step S120, the source electrode 12 is formed. The source electrode 12 is formed on the source region 30 and the p-well contact region 32. The source electrode 12 is formed, for example, by sputtering of nickel (Ni) and aluminum (Al).

In the drain electrode formation step S122, the drain electrode 14 is formed. The drain electrode 14 is formed on the side of the silicon carbide layer 10 closer to the second plane P2. The drain electrode 14 is formed, for example, by sputtering of nickel.

In the contact annealing step S124, third heat treatment is performed. The third heat treatment is performed, for example, at 400° C. or more and 1000° C. or less in a non-oxidizing atmosphere. By the third heat treatment, the contact resistance of the source electrode 12 and the contact resistance of the drain electrode 14 are reduced.

The vertical transistor 100 illustrated in FIG. 1 is formed by the above manufacturing method.

Next, the functions and effects of the semiconductor device according to the first embodiment will be described.

In a case of forming a MOSFET by using a silicon carbide, there is a problem in that it is difficult to reduce on-resistance. One factor causing the increase in on-resistance is considered to be an interface state present at an interface between a silicon carbide layer and a gate insulating layer. It is considered that, due to carriers being trapped or scattered by the interface state, the effective mobility of the carriers is reduced, and thus, the on-resistance is increased.

The vertical transistor 100 according to the first embodiment includes an aluminum nitride layer 16 between the silicon carbide layer 10 and the gate insulating layer 18. An aluminum nitride has a larger band gap than a silicon carbide (SiC). The interface between the silicon carbide layer 10 and the aluminum nitride layer 16 is a heterointerface.

As described above, the aluminum nitride layer 16 has fixed polarization in which the side closer to the gate electrode 20 is negative and the side closer to the silicon carbide layer 10 is positive. The fixed polarization of the aluminum nitride layer 16 is a sum of the spontaneous polarization of the aluminum nitride and the piezoelectric polarization due to the distortion in the layer. Since the aluminum nitride layer 16 has fixed polarization, negative fixed charges are formed on side closer to the gate electrode 20, and positive fixed charges are formed on the side closer to the silicon carbide layer 10.

In order to take electric charge balance with respect to the positive fixed charges formed on the side of the aluminum nitride layer 16 closer to the silicon carbide layer 10, a two-dimensional electron gas is formed on the side of the interface between the silicon carbide layer 10 and the aluminum nitride layer 16 closer to the silicon carbide layer 10. The vertical transistor 100 is a so-called high electron mobility transistor (HEMT).

The electric field created by the spontaneous polarization of the aluminum nitride layer 16 causes the band of the silicon carbide layer 10 to bend downward, and thus, the density of the two-dimensional electron gas becomes very high. Accordingly, a channel through which a large current flows is formed.

As described above, in comparison to a case where hydrogen is not contained, by performing annealing in an atmosphere containing a sufficient amount of hydrogen, misfit dislocations can be reduced to $1/100$ times or less at the stage where the aluminum nitride layer 16 is formed. Even in a case where hydrogen is not contained, the aluminum nitride (AlN) and the silicon carbide (SiC) have close crystal lattice constants, and the interface states are suppressed. Therefore, in comparison to the interface state between the insulating film and the silicon carbide layer in the related art, the interface state at the interface between the aluminum nitride layer 16 and the silicon carbide layer 10 formed by this method is suppressed remarkably.

On the side of the interface between the silicon carbide layer 10 and the aluminum nitride layer 16 closer to the silicon carbide layer 10, a high concentration two-dimensional electron gas is formed, and the interface state is reduced. Therefore, the decrease in effective mobility of carriers is suppressed, and thus, the on-resistance of the vertical transistor 100 can be reduced. Due to the fixed polarization of the aluminum nitride layer 16, the density of the two-dimensional electron gas is increased, so that the on-resistance of the vertical transistor 100 can be further reduced.

In the vertical transistor 100, the potential of the band of the silicon carbide layer 10 bent downward is generally raised by increasing the p-type impurity concentration in p-well region 28. Thus, the threshold voltage of the vertical transistor 100 is increased, and thus, a normally-off transistor can be realized. The threshold voltage of the vertical transistor 100 can be adjusted by the p-type impurity concentration of the p-well region 28.

In the vertical transistor 100, a two-dimensional electron gas is also formed in the source region 30 being in contact with the aluminum nitride layer 16. Therefore, the resistance of source region 30 is reduced. Thus, the parasitic resistance of the vertical transistor 100 can be reduced, and the on-resistance of the vertical transistor 100 can be reduced.

In addition, in the vertical transistor 100, a two-dimensional electron gas is also formed in the drift region 26 being in contact with the aluminum nitride layer 16. Therefore, the resistance of drift region 26 being in contact with aluminum nitride layer 16 is reduced. The drift region 26 with reduced resistance functions as a so-called current spreading layer (CSL). Thus, the on-resistance of the vertical transistor 100 can be reduced.

Herein, the direction from the nitrogen face of the aluminum nitride layer to the aluminum face is referred to as a +C face direction, and the direction from the aluminum face to the nitrogen face is referred to as a −C face direction. Similarly, in a case where the lower layer of the aluminum nitride layer is a silicon carbide layer, the direction from the carbon face to the silicon face is referred to as a +C face direction, and the direction from the silicon face to the carbon face is referred to as a −C face direction.

If an aluminum nitride layer with good crystallinity in the +C face direction is formed on the silicon carbide layer, negative fixed charges are generated on the side of the aluminum nitride layer closer to the front surface, and positive fixed charges are generated on the side closer to the silicon carbide layer. In order to cancel the positive fixed charges, negative free electrons occur on the side of the silicon carbide layer closer to the aluminum nitride layer. This is a two-dimensional electron gas (2DEG). In the first embodiment, the aluminum nitride layer 16 with good crystallinity in the +C face direction is formed on the silicon carbide layer 10.

On the other hand, if an aluminum nitride layer with good crystallinity in the −C face direction is formed on the silicon carbide layer, fixed charges are generated in which the side of the aluminum nitride layer closer to the front surface is positive and the side closer to the silicon carbide layer is negative. In order to cancel the negative fixed charges, positive free holes occur on the side of the silicon carbide layer closer to the aluminum nitride layer. This is a two-dimensional hole gas (2DHG).

In the case of growing an aluminum nitride layer having a +C face on the silicon carbide layer face (that is, the silicon face) of the +C face, since silicon on the front surface and nitrogen easily interact with each other, for example, a sufficient amount of hydrogen is supplied, so that it possible to grow an aluminum nitride layer with good crystallinity. Due to the existence of hydrogen, bond replacement easily occurs, and thus, distortion is easily eliminated. For this reason, it is possible to grow an aluminum nitride layer with good crystallinity.

On the other hand, in the case of growing an aluminum nitride layer having a +C face on the silicon carbide layer face (that is, the carbon face) of the −C face, the carbon on the front surface easily interacts with aluminum, a sufficient amount of nitrogen is supplied, so that is necessary to preferentially grow the nitrogen face of the aluminum nitride. According to the inventor's calculations, for the first time, it has been found that it is possible to grow an aluminum nitride layer having a +C face on the silicon carbide layer face of the −C face by supplying not only hydrogen but also a sufficient amount of nitrogen.

It is understood from the above that, if it is desired to grow the +C face of the aluminum nitride on the m-face, the a-face, the carbon face, and the (0-33-8) face of the silicon carbide layer, the film formation can be performed while a sufficient amount of hydrogen and nitrogen is supplied. Since excessive portions of hydrogen and nitrogen do not interfere with the film formation, a large amount of hydrogen and nitrogen may be introduced. Excessive hydrogen and nitrogen may be exhausted after the film formation.

Even in a case where the aluminum nitride layer is grown on the silicon face of the silicon carbide layer, although a large amount of nitrogen is added, there is no interference to the film formation. Therefore, in order to grow the +C face of the crystalline aluminum nitride layer on the silicon carbide layer, it is effective to introduce a large amount of hydrogen and nitrogen.

As far as the silicon face of the silicon carbide layer is concerned, only by introducing a large amount of hydrogen, an aluminum nitride layer with good crystallinity can be formed. Thus, it has been understood that the +C face of the crystalline aluminum nitride layer can be formed for all the plane orientations on the silicon carbide layer. In this case, a two-dimensional electron gas occurs on the side of the silicon carbide layer closer to the aluminum nitride layer.

It is understood that, if it is desired to grow the −C face of the aluminum nitride layer on the silicon carbide layer, the film formation may be performed while a sufficient amount of hydrogen and aluminum is supplied. Since excessive portions of hydrogen and aluminum do not interfere with the film formation, a large amount of hydrogen and aluminum may be introduced. Excessive hydrogen and aluminum may be exhausted after the film formation.

Even in a case where the −C face of the aluminum nitride layer is grown on the carbon face of the silicon carbide layer, although a large amount of aluminum is added, there is no interference to film formation. Therefore, in order to grow the −C face of the crystalline aluminum nitride layer on the silicon carbide layer, it is effective to introduce a large amount of hydrogen and aluminum.

As far as the carbon face of the silicon carbide layer is concerned, only by introducing a large amount of hydrogen, an aluminum nitride layer with good crystallinity can be formed. Thus, it has been understood that the −C face of the crystalline aluminum nitride layer can be formed for all the plane orientations on the silicon carbide layer. In this case, a two-dimensional hole gas occurs on the side of the silicon carbide layer closer to the aluminum nitride layer.

In the vertical transistor 100, the gate insulating layer 18 having a wider band gap than the aluminum nitride layer 16 is provided between the aluminum nitride layer 16 and the gate electrode 20. By providing the gate insulating layer 18, it is possible to suppress the leak current between the silicon carbide layer 10 and the gate electrode 20.

The thickness of the aluminum nitride layer 16 is preferably larger than 10 nm, more preferably larger than 30 nm, and still more preferably larger than 35 nm.

The crystalline aluminum nitride layer 16 exhibits spontaneous polarization in the direction of having negative charges on the side closer to the aluminum face and positive charges on side closer to the nitrogen. Since bonding is made in the c-axis direction from aluminum and nitrogen constituting the bilayer toward aluminum in the lower bilayer, the bond mainly constitutes the spontaneous polarization.

If the thickness of the crystalline aluminum nitride layer 16 is large, the negative charges are induced in the silicon carbide layer in order to compensate for the positive charges on a layer underlying the polarization. If the thickness of the aluminum nitride layer 16 becomes small, due to the negative charges on the upper layer, the negative charges induced in the silicon carbide layer are decreased.

If the thickness of the aluminum nitride layer 16 is larger than 10 nm, the negative charges induced in the silicon carbide layer are sufficiently increased. If the thickness of the aluminum nitride layer 16 is larger than 30 nm, it is considered that the influence of the negative charges on the upper layer is extremely small. If the thickness of the aluminum nitride layer 16 is larger than 35 nm, it is considered that the influence of the negative charges on the upper layer disappears.

Therefore, by allowing the thickness of the aluminum nitride layer 16 to be large, the density of the two-dimensional electron gas is increased. Thus, the on-resistance is reduced.

If the thickness of the aluminum nitride layer 16 becomes large, there is a concern that misfit dislocations may occur due to lattice mismatch between the silicon carbide layer 10 and the aluminum nitride layer 16. If the misfit dislocations occur, there is a concern that, for example, a decrease in effective mobility and an increase in junction leak current occur.

It has been revealed that the misfit dislocation density can be minimized by introducing a large amount of hydrogen at the time of film formation of the aluminum nitride layer 16 as in the manufacturing method according to the first embodiment. Therefore, for example, even in a case where the thickness of the aluminum nitride layer 16 is larger than 30 nm, it is possible to form the aluminum nitride layer 16 having a low misfit dislocation density.

Therefore, even in a case where the thickness of the aluminum nitride layer 16 becomes large, the decrease in effective mobility due to the misfit dislocations is suppressed, and thus, the on-resistance of the vertical transistor 100 is reduced. In addition, the increase in junction leak due to misfit dislocation is also suppressed.

The thickness of the aluminum nitride layer 16 is preferably 60 nm or less, and more preferably 50 nm or less.

The thickness of the aluminum nitride layer 16 is set to be small, so that the reduction in threshold voltage of the vertical transistor 100 is suppressed. In addition, the on/off control of the vertical transistor 100 by the voltage applied to the gate electrode 20 is facilitated.

In addition, the thickness of the aluminum nitride layer 16 is set to be small, so that the occurrence of misfit dislocations due to lattice mismatch between the silicon carbide layer 10 and the aluminum nitride layer 16 is suppressed. Therefore, the decrease in effective mobility due to the misfit dislocation is suppressed, and thus, the on-resistance of the vertical transistor 100 is reduced. In addition, the increase in junction leak due to the misfit dislocation is also suppressed.

The p-type impurity concentration of the p-well region 28 is preferably $1\times10^{16}$ cm$^{-3}$ or more, more preferably $1\times10^{17}$ cm$^{-3}$ or more, and still more preferably $5\times10^{17}$ cm$^{-3}$ or more, further still more preferably, $1\times10^{18}$ cm$^{-3}$ or more, and most preferably $5\times10^{18}$ cm$^{-3}$ or more. By increasing the p-type impurity concentration, the threshold voltage is increased, and thus, the normally-off transistor can be easily realized.

The p-type impurity concentration of the p-well region 28 is preferably $1\times10^{20}$ cm$^{-3}$ or less, and more preferably $5\times10^{19}$ cm$^{-3}$ or less. The p-type impurity concentration is reduced, so that the occurrence of crystal defects is suppressed.

In addition, for example, negative charges are introduced into the gate insulating layer 18, so that the threshold voltage of the vertical transistor 100 can also be increased.

The angle ($\theta$ in FIG. 4) between the c-axis direction of the aluminum nitride crystal contained in the aluminum nitride layer 16 and the direction (Z in FIG. 4) from the p-well region 28 toward the gate electrode 20 is preferably 45 degrees or less, more preferably 30 degrees or less, and still more preferably 10 degrees or less. As the angle $\theta$ is decreased, the positive fixed charges generated in the silicon carbide layer 10 due to the fixed polarization of the aluminum nitride layer 16 are increased. Therefore, the density of the two-dimensional electron gas is increased, and thus, the on-resistance of the vertical transistor 100 can be reduced.

The thickness of the gate insulating layer 18 is preferably larger than 10 nm, more preferably 30 nm or more, and still more preferably 35 nm or more in terms of the silicon oxide equivalent thickness. The thickness of the gate insulating layer 18 is large in terms of the silicon oxide equivalent thickness, so that the leakage current between silicon carbide layer 10 and gate electrode 20 is effectively suppressed.

The thickness of the gate insulating layer 18 is preferably 50 nm or less in terms of the silicon oxide equivalent thickness. The thickness of the gate insulating layer 18 is set to be 50 nm or less, so that the on/off control of the vertical transistor 100 by the voltage applied to the gate electrode 20 is facilitated.

As described above, according to the first embodiment, a transistor with reduced on-resistance can be realized by suppressing the decrease ineffective mobility of carriers and increasing the carrier density.

Second Embodiment

A semiconductor device according to a second embodiment is different from the semiconductor device according to the first embodiment in that the second silicon carbide region includes a first portion and a second portion which is located between the first portion and the aluminum nitride layer and has the second conductivity type impurity concentration lower than that of the first portion. Hereinafter, the description of the same contents as those of the first embodiment will be partially omitted.

Figure 6:
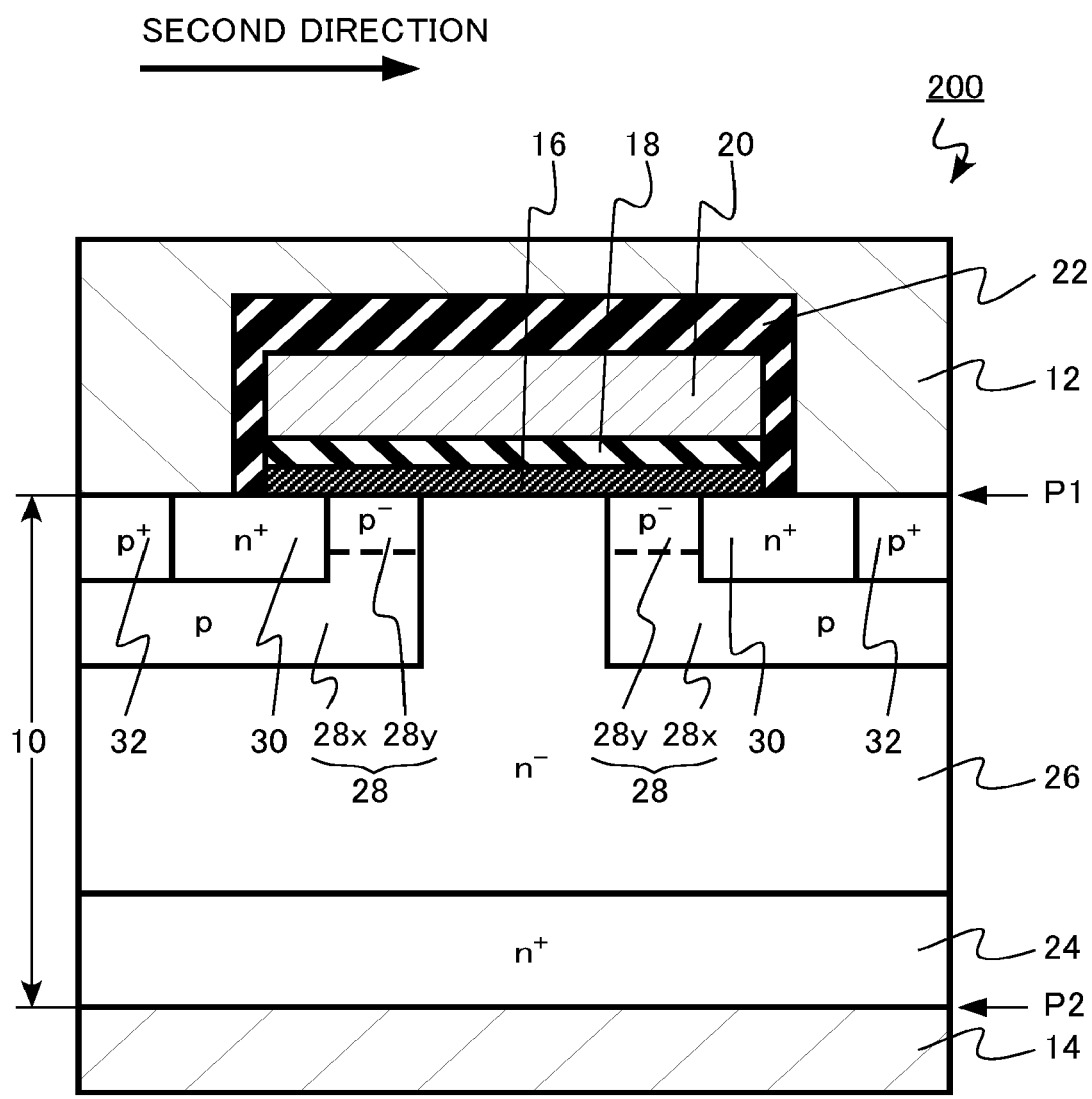
FIG. 6 is a schematic cross-sectional view of a semiconductor device according to a second embodiment.

FIG. 6 is a schematic cross-sectional view of the semiconductor device according to the second embodiment. The semiconductor device according to the second embodiment is a vertical transistor 200. The vertical transistor 200 is a transistor having electrons as carriers.

The vertical transistor 200 includes a silicon carbide layer 10, a source electrode 12 (first electrode), a drain electrode 14 (second electrode), an aluminum nitride layer 16, a gate insulating layer 18 (insulating layer), a gate electrode 20, and an interlayer insulating layer 22.

A drain region 24, a drift region 26 (first silicon carbide region), a p-well region 28 (second silicon carbide region), a source region 30 (third silicon carbide region), and a p-well contact region 32 exist in the silicon carbide layer 10.

The p-well region 28 has a first portion 28x and a second portion 28y. The p-type impurity concentration of the second portion 28y is lower than the p-type impurity concentration of the first portion 28x. For example, the p-type impurity concentration of the second portion 28y is ⅕ or less of the p-type impurity concentration of the first portion 28x. In addition, for example, the p-type impurity concentration of the second portion 28y is ⅒ or less of the p-type impurity concentration of the first portion 28x. In addition, for example, the p-type impurity concentration of the second portion 28y is 1/100 or less of the p-type impurity concentration of the first portion 28x.

In the vertical transistor 200, the second portion 28y having a low p-type impurity concentration is provided in the vicinity of the aluminum nitride layer 16 in which a two-dimensional electron gas is generated. The second portion 28y has, for example, a low density of crystal defects associated with the introduction of the p-type impurities by ion implantation.

According to the second embodiment, similarly to the first embodiment, a transistor with reduced on-resistance is realized. In addition, according to the second embodiment, in the second portion 28y in which a two-dimensional electron gas is generated, a decrease in effective mobility of electrons due to the p-type impurities or the crystal defects is suppressed. Therefore, a transistor with a further reduced on-resistance is realized.

Third Embodiment

A semiconductor device according to a third embodiment is different from the semiconductor device according to the first embodiment in that the aluminum nitride layer contains boron (B). Hereinafter, the description of the same contents as those of the first embodiment will be partially omitted.

The semiconductor device according to the third embodiment is a vertical transistor. The vertical transistor is a transistor having electrons as carriers.

In the vertical transistor of the third embodiment, the aluminum nitride layer 16 contains boron (B). The boron (B) is substituted for a portion of aluminum (Al) of the aluminum nitride in the aluminum nitride layer 16. The boron concentration of the aluminum nitride layer 16 is, for example, 2 atomic % or more.

The boron concentration of the aluminum nitride layer 16 can be measured, for example, by SIMS.

The boron is contained in the aluminum nitride layer 16, so that the lattice constant of the aluminum nitride becomes small. Therefore, the occurrence of misfit dislocations due to the lattice mismatch between the silicon carbide layer 10 and the aluminum nitride layer 16 is suppressed. Therefore, the decrease in effective mobility due to the misfit dislocations is suppressed. In addition, the increase in junction leak due to the misfit dislocations is also suppressed.

According to the third embodiment, similarly to the first embodiment, a transistor with reduced on-resistance is realized. In addition, according to the third embodiment, the decrease in effective mobility due to the misfit dislocations is suppressed. Therefore, a transistor with further reduced on-resistance is realized. In addition, a transistor in which the increase in junction leak due to the misfit dislocations is suppressed is realized.

Fourth Embodiment

A semiconductor device according to a fourth embodiment is different from the semiconductor device according to the first embodiment in that the aluminum nitride layer contains at least one element selected from a group consisting of scandium (Sc), yttrium (Y), and lanthanides (La, Ce, Pr, Nd, Pm, Sm, Eu, Gd, Tb, Dy, Ho, Er, Tm, Yb, and Lu). Hereinafter, the description of the same contents as those of the first embodiment will be partially omitted.

The semiconductor device according to the fourth embodiment is a vertical transistor. The vertical transistor is a transistor having electrons as carriers.

In the vertical transistor according to the fourth embodiment, the aluminum nitride layer 16 contains at least one element selected from a group consisting of scandium (Sc), yttrium (Y), and lanthanides (La, Ce, Pr, Nd, Pm, Sm, Eu, Gd, Tb, Dy, Ho, Er, Tm, Yb, and Lu). The at least one element is substituted for a portion of aluminum (Al) of an aluminum nitride in the aluminum nitride layer 16. The concentration of the at least one element in the aluminum nitride layer 16 is, for example, 2 atomic % or more.

The concentration of the at least one element of the aluminum nitride layer 16 can be measured, for example, by SIMS.

At least one element selected from a group consisting of scandium (Sc), yttrium (Y), and lanthanides (La, Ce, Pr, Nd, Pm, Sm, Eu, Gd, Tb, Dy, Ho, Er, Tm, Yb, and Lu) is lower in electro negativity than aluminum (Al). Accordingly, the aluminum nitride layer 16 contains the at least one element, so that the spontaneous polarization of the aluminum nitride layer 16 is increased. Therefore, the density of the two-dimensional electron gas formed by the electric field generated by the spontaneous polarization of the aluminum nitride layer 16 is increased.

According to the fourth embodiment, similarly to the first embodiment, a transistor with reduced on-resistance can be realized. In addition, according to the fourth embodiment, the density of the two-dimensional electron gas is increased, and thus, a transistor with further reduced on-resistance can be realized.

Fifth Embodiment

A semiconductor device according to a fifth embodiment is different from the semiconductor device according to the first embodiment in that the silicon carbide layer has a trench and the gate electrode is located in the trench. In addition, the semiconductor device according to the fifth embodiment is different from the semiconductor device according to the first embodiment in that the surface of the second silicon carbide region being in contact with the aluminum nitride layer is a plane inclined at an angle of 0 degrees to 10 degrees with respect to the m-face, or a plane inclined at an angle of 0 degrees to 10 degrees with respect to the a-face. Hereinafter, the description of the same contents as those of the first embodiment will be partially omitted.

Hereinafter, a case where the surface of the second silicon carbide region being in contact with the aluminum nitride layer is a plane inclined at an angle of 0 degrees to 10 degrees with respect to the m-face will be described as an example.

Figure 7:
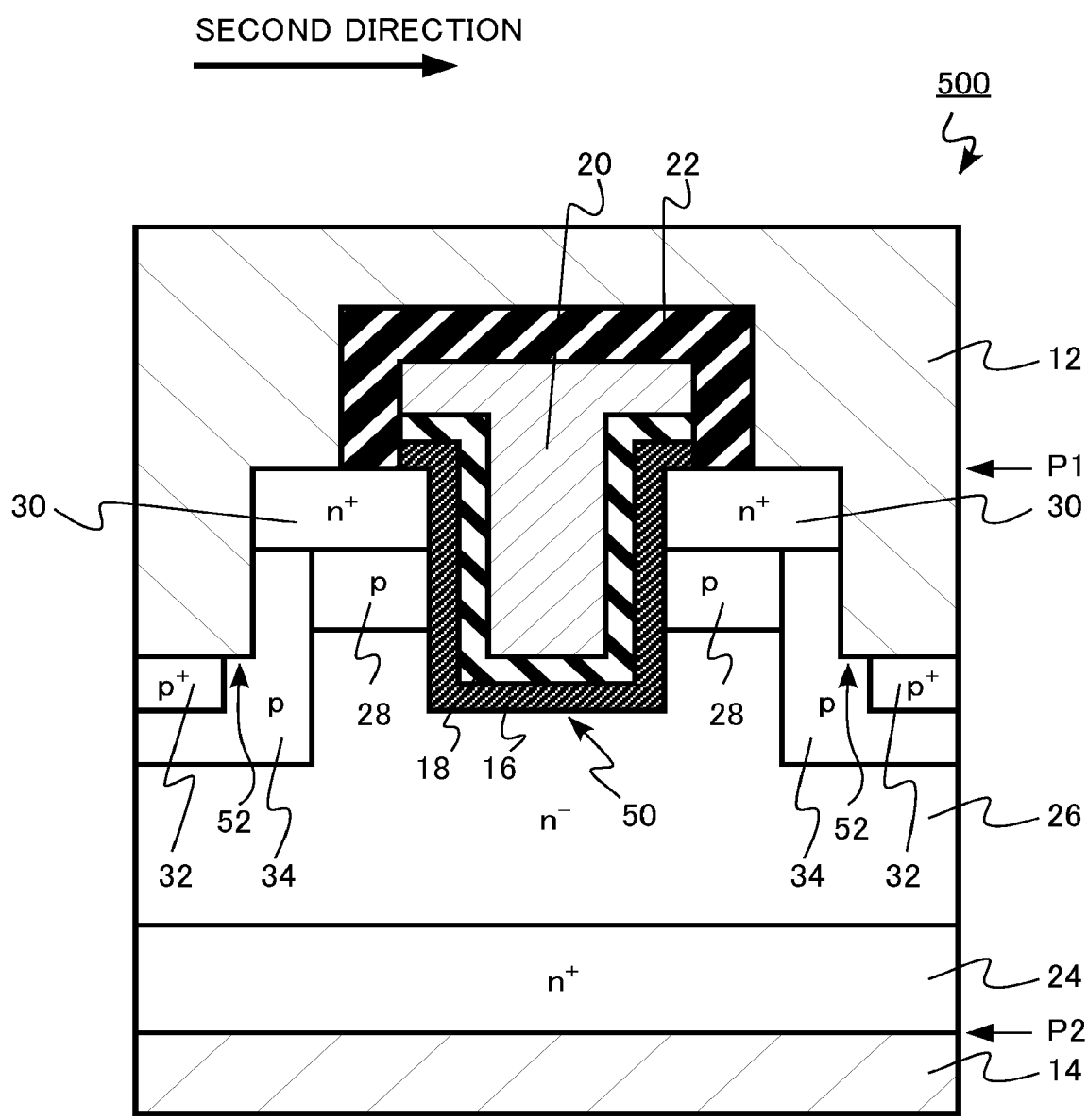
FIG. 7 is a schematic cross-sectional view of a semiconductor device according to a fifth embodiment.

FIG. 7 is a schematic cross-sectional view of the semiconductor device according to the fifth embodiment. The semiconductor device according to the fifth embodiment is a trench gate type vertical transistor 500 having a gate electrode in a trench. The vertical transistor 500 is a transistor having electrons as carriers.

The vertical transistor 500 includes a silicon carbide layer 10, a source electrode 12 (first electrode), a drain electrode 14 (second electrode), an aluminum nitride layer 16, a gate insulating layer 18 (insulating layer), a gate electrode 20, an interlayer insulating layer 22, a first trench 50 (trench), and a second trench 52.

A drain region 24, a drift region 26 (first silicon carbide region), a p-well region 28 (second silicon carbide region), a source region 30 (third silicon carbide region), a p-well contact region 32, and an electric field relaxation region 34 exist in the silicon carbide layer 10.

The silicon carbide layer 10 includes a first trench 50 and a second trench 52. The first trench 50 is interposed between two second trenches 52.

The first trench 50 penetrates the p-well region 28 to reach the drift region 26. The bottom of the first trench 50 is located in the drift region 26.

The aluminum nitride layer 16, the gate insulating layer 18, and the gate electrode 20 are located in the first trench 50. The aluminum nitride layer 16 and the p-well region 28 are in contact with the side face of the first trench 50. The p-well region 28 in the vicinity of the aluminum nitride layer 16 becomes the channel region of the vertical transistor 500.

A portion of the source electrode 12 is located in the second trench 52. The p-well contact region 32 is located at the bottom of the second trench 52.

The electric field relaxation region 34 is a p-type SiC. The electric field relaxation region 34 is located around the second trench 52.

The electric field relaxation region 34 contains, for example, aluminum (Al) as p-type impurities. The p-type impurity concentration of the p-well region 28 is, for example, $1 \times 10^{16}$ cm$^{-3}$ or more and $1 \times 10^{20}$ cm$^{-3}$ or less.

When the vertical transistor 500 is in the off state, a depletion layer extends from the electric field relaxation region 34 to the drift region 26. Due to the depletion layer extending to the drift region 26, the electric field strength applied to the gate insulating layer 18 at the bottom of the first trench 50 is relaxed. Therefore, the breakdown voltage of the gate insulating layer 18 is improved.

Figure 8:
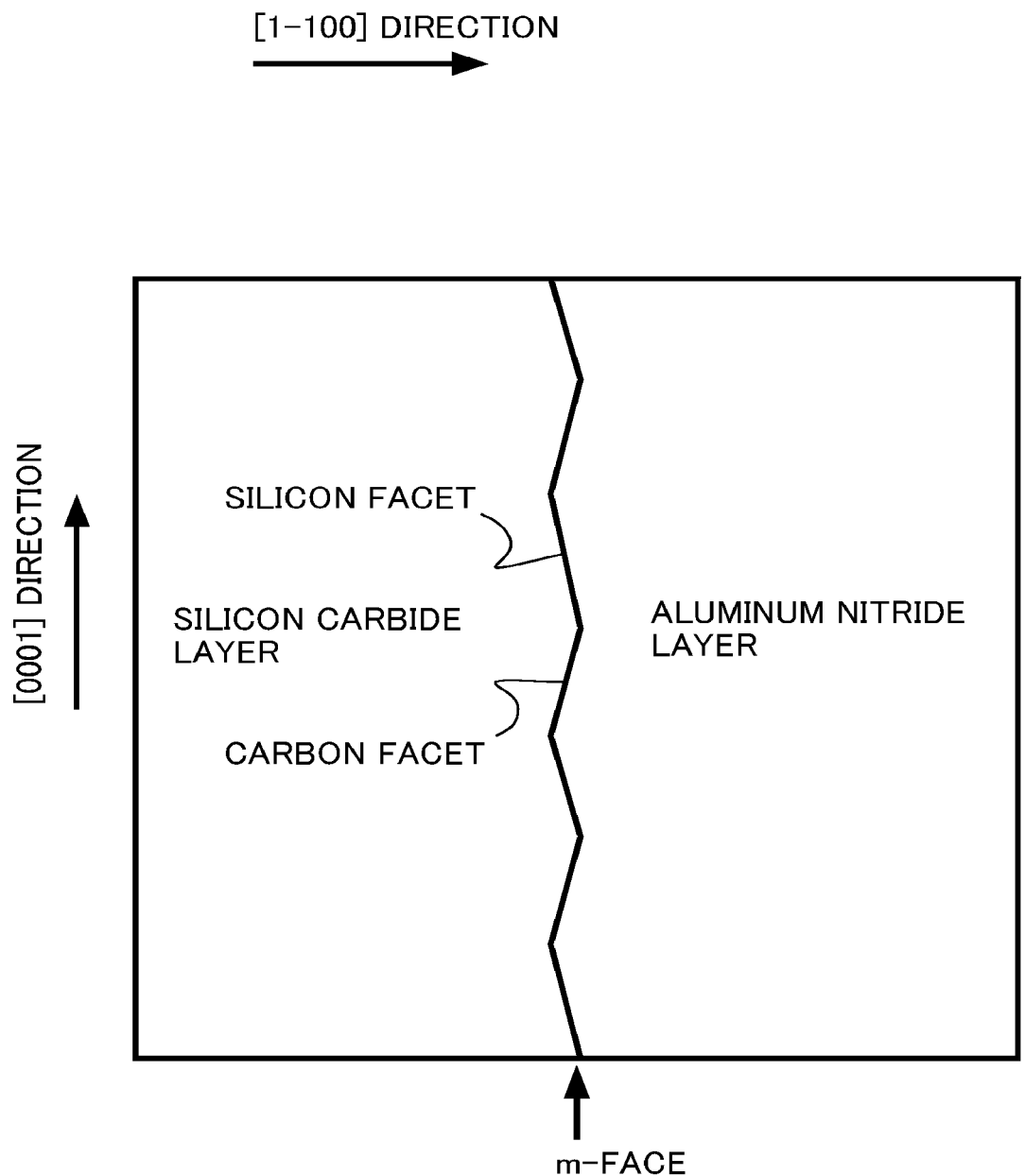
FIG. 8 is an explanatory view of an aluminum nitride layer of the semiconductor device according to the fifth embodiment.

FIG. 8 is an explanatory view of the aluminum nitride layer of the semiconductor device according to the fifth embodiment. FIG. 8 is an enlarged cross-sectional view of the side face of the first trench 50. FIG. 8 is an enlarged cross-sectional view of a portion where the aluminum nitride layer 16 and the p-well region 28 are in contact with each other.

The side face of the first trench 50 is a plane having an off angle of 0 degrees or more and 10 degrees or less with respect to the m-face. The surface of the p-well region 28 in contact with the aluminum nitride layer 16 is a plane inclined at an angle of 0 degrees or more and 10 degrees or less with respect to the m-face.

The second direction illustrated in FIG. 7 is, for example, a [1-100] direction. As illustrated in FIG. 8, the silicon facets and the carbon facets are arranged to be alternately repeated on the front surface of the side face of the first trench 50. In addition, FIG. 8 illustrates a case where the side face of the first trench 50 is an m-face.

The front surface of the silicon facets has the same structure as the silicon face. The front surface of the carbon facets has the same structure as the carbon face.

Also, in the vertical transistor 500, similarly to the vertical transistor of the first embodiment, the angle θ between the c-axis direction of the aluminum nitride crystal contained in the aluminum nitride layer 16 and the direction from the p-well region 28 toward the gate electrode 20 is less than 90 degrees. In other words, the angle θ between the c-axis direction of the aluminum nitride crystal contained in the aluminum nitride layer 16 and the direction toward the gate electrode 20 normal to the surface of the p-well region 28 being in contact with the aluminum nitride layer 16 is less than 90 degrees. The angle θ between the c-axis direction of the aluminum nitride crystal contained in the aluminum nitride layer 16 and the direction from the p-well region 28 toward the gate electrode 20 is, for example, 45 degrees or less.

In the fifth embodiment, similarly to the vertical transistor according to the first embodiment, the aluminum nitride layer 16 with good crystallinity in the +C face direction is formed on the silicon carbide layer 10.

A two-dimensional electron gas is formed in the p-well region 28 in the vicinity of the aluminum nitride layer 16. The aluminum nitride layer 16 has a spontaneous polarization in which the side closer to the gate electrode 20 is negative and the side closer to the silicon carbide layer 10 is positive. Due to the spontaneous polarization of the aluminum nitride layer 16, the density of the two-dimensional electron gas is increased. Thus, the on-resistance of the vertical transistor 100 can be reduced.

In a case where the aluminum nitride layer is formed on the carbon face, similarly to the silicon face, the aluminum nitride layer is formed so that the c-axis direction of the aluminum nitride crystal is aligned with the c-axis direction of the silicon carbide layer. The carbon atoms existing on the outermost face of the carbon face are negatively charged. Since the carbon atoms are negatively charged, at the time of forming the aluminum nitride layer, positively charged aluminum atoms are likely to exist on the side of the silicon carbide layer 10 closer to the front surface. In other words, an aluminum nitride layer in the −C face direction is easily formed on the silicon carbide layer.

For this reason, in the aluminum nitride layer 16, negative fixed charges are formed on the side closer to the silicon carbide layer 10. In order to cancel the negative fixed charges, positive free holes occur on the front surface of the side of the aluminum nitride layer closer to the silicon carbide layer.

However, as described above, at the time of forming the aluminum nitride layer on the carbon face, it is possible to grow an aluminum nitride layer having a +C face by supplying a sufficient amount of nitrogen. An aluminum nitride layer having positive fixed charges can be formed on the side closer to the silicon carbide layer.

At the time of forming the aluminum nitride layer 16 in the first trench 50, the formation is performed, for example, under the condition that hydrogen and nitrogen are excessive. According to this method, even on the m-face where the silicon facets and the carbon facets are alternately repeated on the front surface, the aluminum nitride layer 16 can be formed so that the c-axis direction of the aluminum nitride crystal is aligned with the direction from the p-well region 28 toward the gate electrode 20. In other words, the aluminum nitride layer 16 is formed so that the negative fixed charges exist on the side closer to the gate electrode 20 and the positive fixed charges exist on the side closer to the silicon carbide layer 10. The aluminum nitride layer 16 is formed by, for example, an ALD method or a CVD method.

In the front surface of the side of the p-well region 28 closer to the aluminum nitride layer 16, the front surface of the side of the drift region 26 closer to the aluminum nitride layer 16, and the front surface of the side of the source region 30 closer to the aluminum nitride layer 16, a large number of free electrons (two-dimensional electron gas) are formed in order to take electric charge balance.

In addition, it is preferable that, a p-type silicon carbide region being in contact with trench 50 and fixed to the same potential as the source electrode 12 is provided to the bottom of trench 50. By providing the p-type silicon carbide region to the bottom of trench 50, the breakdown voltage of gate insulating layer 18 is improved.

As described above, according to the fifth embodiment, similarly to the first embodiment, a transistor with reduced on-resistance can be realized. In addition, according to the fifth embodiment, by employing the trench gate type, the channel density of the semiconductor chip is increased, and thus, a transistor with further reduced on-resistance can be realized.

Sixth Embodiment

A semiconductor device according to a sixth embodiment includes: a silicon carbide layer having a first plane and a second plane facing the first plane; a first silicon carbide region of a first conductivity type existing in the silicon carbide layer; a second silicon carbide region of a second conductivity type existing in the silicon carbide layer and being located between the first silicon carbide region and the first plane; a third silicon carbide region of the first conductivity type existing in the silicon carbide layer and being located between the second silicon carbide region and the first plane; a fourth silicon carbide region of the second conductivity type existing in the silicon carbide layer and being located between the first silicon carbide region and the first plane; a fifth silicon carbide region of the first conductivity type existing in the silicon carbide layer and being located between the fourth silicon carbide region and the first plane; a sixth silicon carbide region of the second conductivity type existing in the silicon carbide layer, being located between the first silicon carbide region and the first plane, and being in contact with the second silicon carbide region and the fourth silicon carbide region; a seventh silicon carbide region of the second conductivity type existing in the silicon carbide layer, being located between the first silicon carbide region and the first plane, and being in contact with the second silicon carbide region and the fourth silicon carbide region; an eighth silicon carbide region of the first conductivity type existing in the silicon carbide layer, being located between the first silicon carbide region and the first plane, being located between the second silicon carbide region and the fourth silicon carbide region, being located between the sixth silicon carbide region and the seventh silicon carbide region, being located between the sixth silicon carbide region and the first plane, and being located between the seventh silicon carbide region and the first plane; a first electrode located on a side of the silicon carbide layer closer to the first plane; a second electrode located on a side of the silicon carbide layer closer to the second plane; a gate electrode, an aluminum nitride layer located between the second silicon carbide region and the gate electrode and between the fourth silicon carbide region and the gate electrode, the aluminum nitride layer containing an aluminum nitride crystal; and an insulating layer located between the aluminum nitride layer and the gate electrode and having a wider band gap than the aluminum nitride layer. The semiconductor device according to the sixth embodiment is different from the semiconductor device according to the first embodiment in that a sixth silicon carbide region, a seventh silicon carbide region, and an eighth silicon carbide region are provided. Hereinafter, the description of the same contents as those of the first embodiment will be partially omitted.

Hereinafter, a case where the first conductivity type is n-type and the second conductivity type is p-type will be described as an example.

Figure 9:
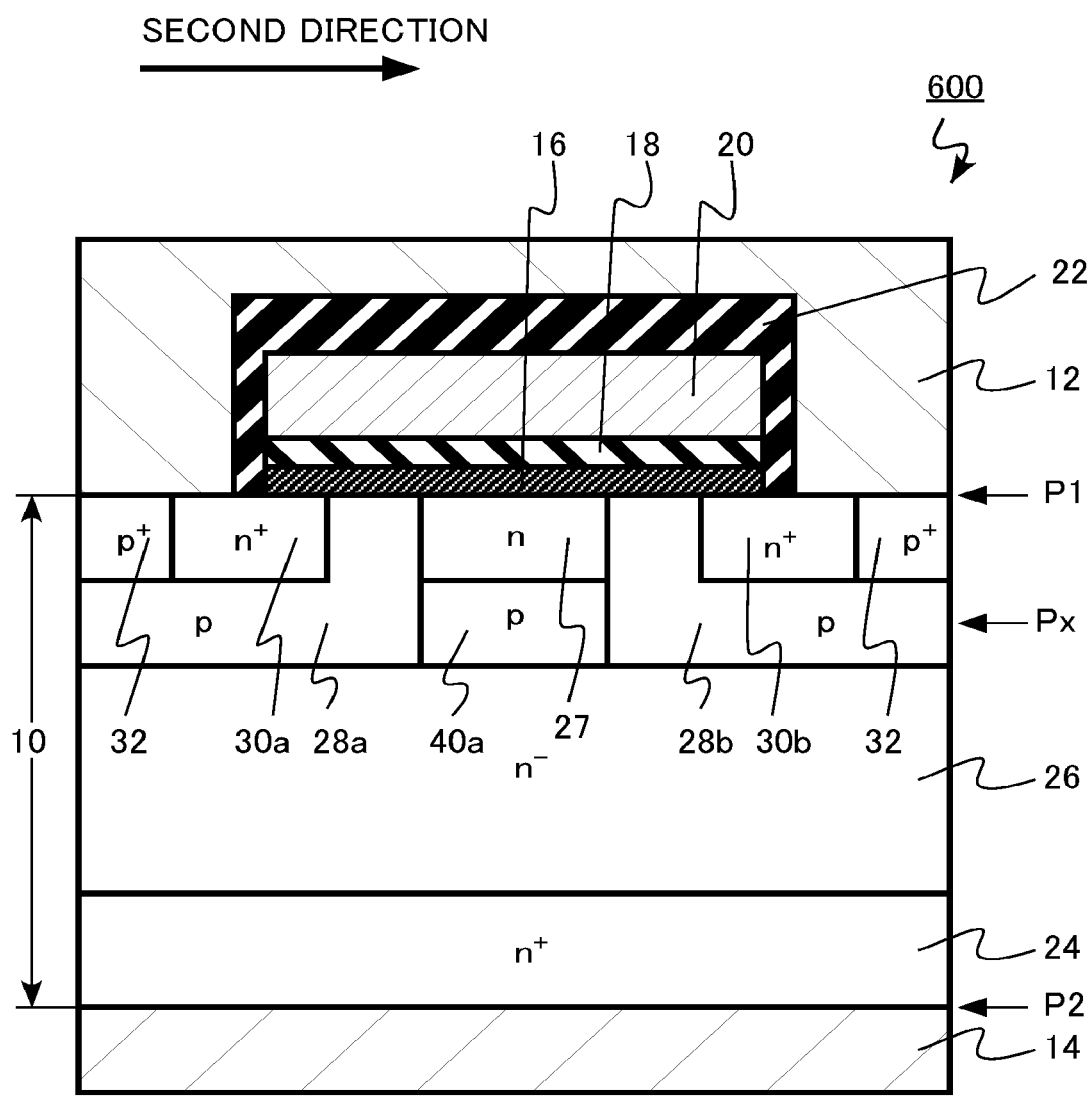
FIG. 9 is a schematic cross-sectional view of a semiconductor device according to a sixth embodiment.

FIG. 9 is a schematic cross-sectional view of the semiconductor device according to the sixth embodiment. The semiconductor device according to the sixth embodiment is a vertical transistor 600. The vertical transistor 600 is a transistor having electrons as carriers.

Figure 10:
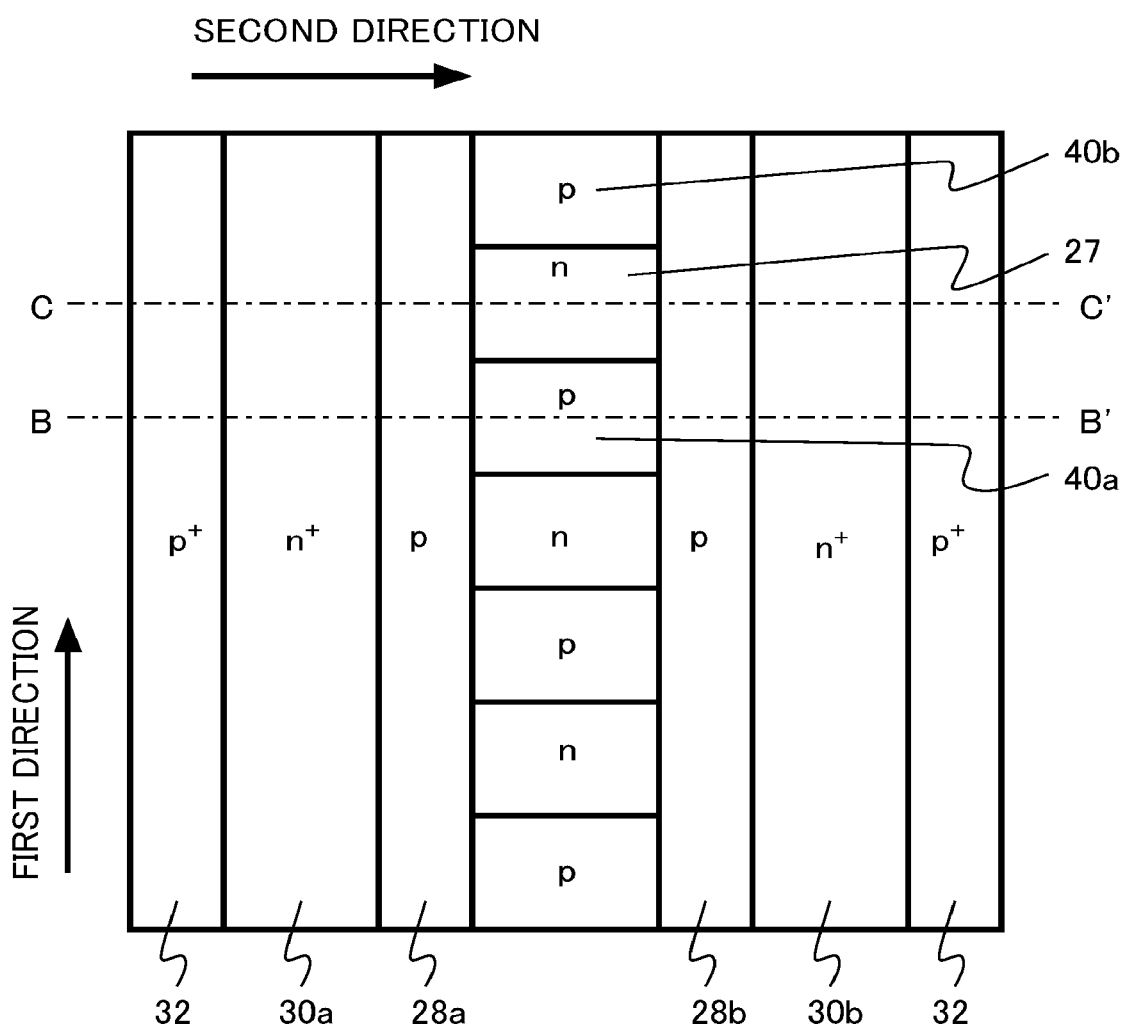
FIG. 10 is a schematic top view of the semiconductor device according to the sixth embodiment.

FIG. 10 is a schematic cross-sectional view of the semiconductor device according to the sixth embodiment. FIG. 10 is a view illustrating a cross section of the plane Px (refer to FIGS. 9 and 11) of silicon carbide layer 10. FIG. 9 is a cross-sectional view taken along line BB' of FIG. 10.

Figure 11:
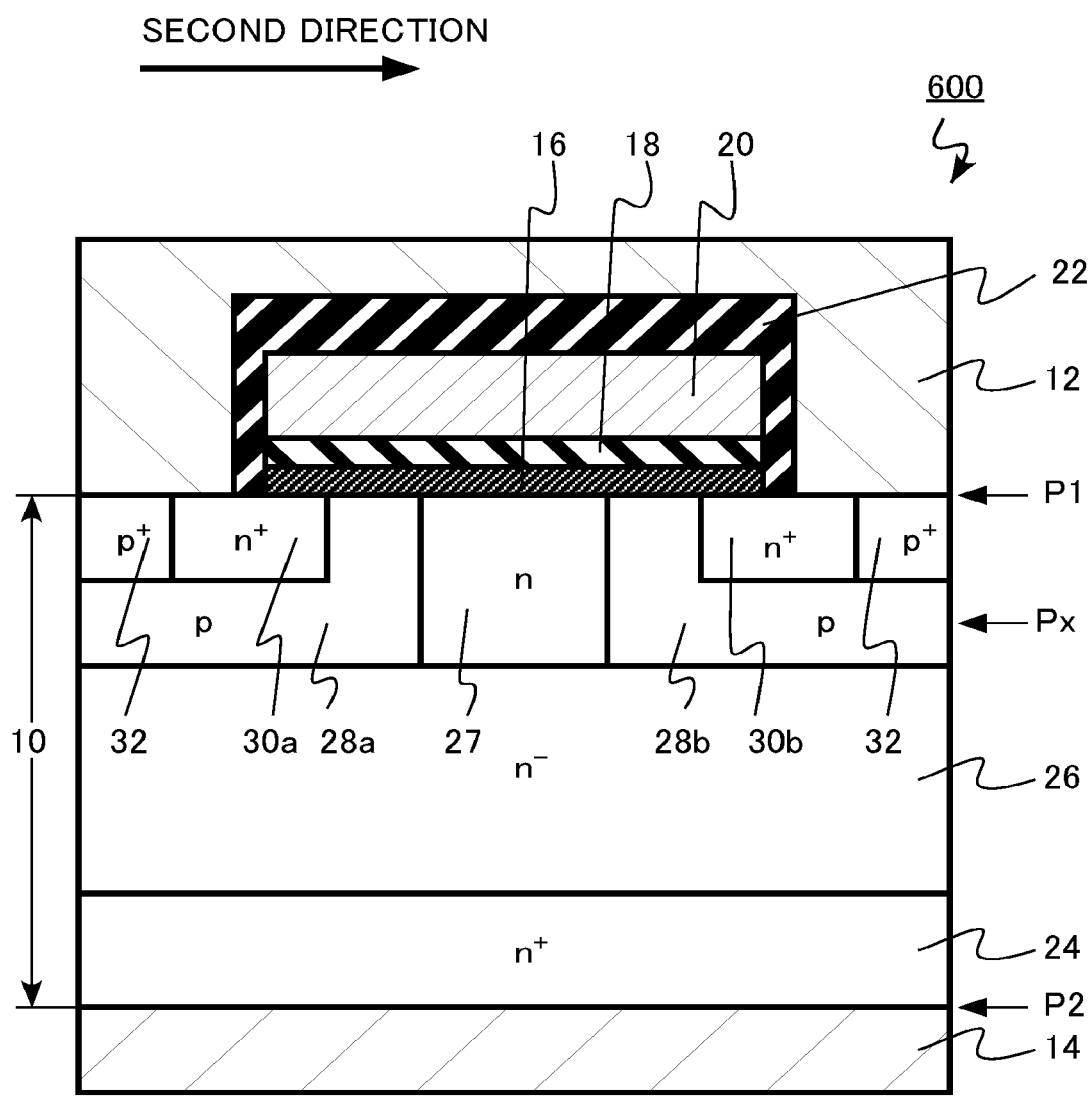
FIG. 11 is a schematic cross-sectional view of the semiconductor device according to the sixth embodiment.

FIG. 11 is a schematic cross-sectional view of the semiconductor device according to the sixth embodiment. FIG. 11 is a cross-sectional view taken along line CC' of FIG. 10.

The vertical transistor 600 includes a silicon carbide layer 10, a source electrode 12 (first electrode), a drain electrode 14 (second electrode), an aluminum nitride layer 16, a gate insulating layer 18 (insulating layer), a gate electrode 20, and an interlayer insulating layer 22.

A drain region 24, a drift region 26 (first silicon carbide region), an n-type region 27 (eighth silicon carbide region), a first p-well region 28a (second silicon carbide region), a second p-well region 28b (fourth silicon carbide region), a first source region 30a (third silicon carbide region), a second source region 30b (fifth silicon carbide region), a p-well contact region 32, a first p-type region 40a (sixth silicon carbide region), and a second p-type region 40b (seventh silicon carbide region) exist in the silicon carbide layer 10.

The first p-well region 28a and the second p-well region 28b are p-type SiCs. The first p-well region 28a and the second p-well region 28b are located between the drift region 26 and the first plane P1. A portion of the first p-well region 28a and a portion of the second p-well region 28b are in contact with the first plane P1. The first p-well region 28a and the second p-well region 28b extend in the first direction.

The second p-well region 28b interposes the n-type region 27 between the first p-well region 28a and the second p-well region 28b.

The first p-well region 28a and the second p-well region 28b contain, for example, aluminum (Al) as p-type impurities. The p-type impurity concentration of the first p-well region 28a and the second p-well region 28b is, for example, $1 \times 10^{16}$ cm$^{-3}$ or more and $1 \times 10^{20}$ cm$^{-3}$ or less. The p-type impurity concentration of the first p-well region 28a and the second p-well region 28b is, for example, $5 \times 10^{18}$ cm$^{-3}$ or more.

The depth of the first p-well region 28a and the depth of the second p-well region 28b are, for example, 0.4 μm or more and 0.8 μm or less. The first p-well region 28a and the second p-well region 28b function as a channel region of the vertical transistor 600.

The first source region 30a and the second source region 30b are n+-type SiCs. The first source region 30a is located between the first p-well region 28a and the first plane P1. The second source region 30b is located between the second p-well region 28b and the first plane P1. A portion of the first source region 30a and a portion of the second source region 30b are in contact with the first plane P1. The first source region 30a and the second source region 30b extend in the first direction.

The first source region 30a and the second source region 30b contain, for example, phosphorus (P) as n-type impurities. The n-type impurity concentrations of the first source region 30a and the second source region 30b are, for example, $1 \times 10^{18}$ cm$^{-3}$ or more and $1 \times 10^{22}$ cm$^{-3}$ or less. The n-type impurity concentrations of the first source region 30a and the second source region 30b are higher than the n-type impurity concentration of the drift region 26.

The depths of the first source region 30a and the second source region 30b are smaller than the depths of the first p-well region 28a and the second p-well region 28b. The depth of the first source region 30a and the depth of the second source region 30b are, for example, 0.2 μm or more and 0.4 μm or less.

The first p-type region 40a and the second p-type region 40b are p-type SiCs. The first p-type region 40a and the second p-type region 40b are located between the drift region 26 and the first plane P1.

The first p-type region 40a and the second p-type region 40b are in contact with the first p-well region 28a and the second p-well region 28b. The first p-type region 40a and the second p-type region 40b are located between the first p-well region 28a and the second p-well region 28b. The second p-type region 40b interposes the n-type region 27 between the first p-type region 40a and the second p-type region 40b.

The first p-type region 40a and the second p-type region 40b contain, for example, aluminum (Al) as p-type impurities. The p-type impurity concentration of the first p-type region 40a and the second p-type region 40b is, for example, $1 \times 10^{16}$ cm$^{-3}$ or more and $1 \times 10^{20}$ cm$^{-3}$ or less.

The depth of the first p-type region 40a and the depth of the second p-type region 40b are, for example, 0.4 μm or more and 0.8 μm or less.

The n-type region 27 is an n-type SiC. The n-type region 27 is located between the first p-well region 28a and the second p-well region 28b. The n-type region 27 is located between the first p-type region 40a and the second p-type region 40b. The n-type region 27 is located between the first p-well region 28a and the first plane P1. The n-type region 27 is located between the second p-well region 28b and the first plane P1.

The n-type region 27 contains, for example, phosphorus (P) as n-type impurities. The n-type impurity concentration of the n-type region 27 is, for example, $5 \times 10^{15}$ cm$^{-3}$ or more and $1 \times 10^{10}$ cm$^{-3}$ or less. More preferably, the n-type impurity concentration of the n-type region 27 is $2 \times 10^{16}$ cm$^{-3}$ or more and $1 \times 10^{18}$ cm$^{-3}$ or less. The n-type impurity concentration of the n-type region 27 is higher than the n-type impurity concentration of the drift region 26.

In the vertical transistor 600, the n-type region 27 having a higher n-type impurity concentration than the drift region 26 is provided between the first p-well region 28a and the second p-well region 28b, so that the resistance of the so-called JFET region becomes low. In addition, due to the fixed electrode of the aluminum nitride layer 16, negative charges are likely to occur in the n-type region 27. Therefore, the on-resistance of the vertical transistor 600 is reduced.

In addition, the vertical transistor 600 includes the first p-type region 40a and the second p-type region 40b, so that the current path is narrowed. Therefore, when the load of the vertical transistor 600 is short-circuited, the amount of current flowing between the drain electrode 14 and the source electrode 12 can be suppressed. Therefore, the short circuit withstand capability of the vertical transistor 600 is improved.

As described above, according to the sixth embodiment, similarly to the first embodiment, a transistor with reduced on-resistance is realized. In addition, according to the sixth embodiment, a transistor with an improved short circuit withstand capability is realized.

Seventh Embodiment

An inverter circuit and a driving device according to the seventh embodiment are a driving device provided with a semiconductor device according to the seventh embodiment.

Figure 12:
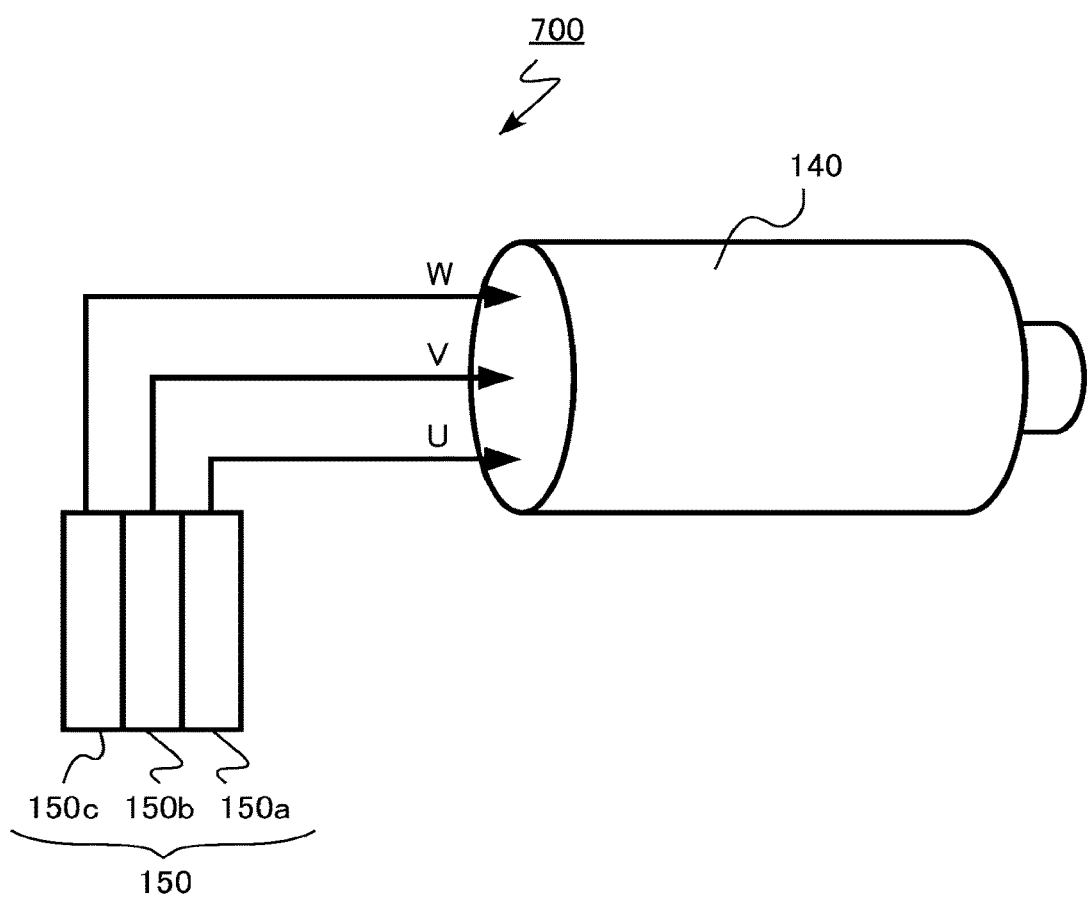
FIG. 12 is a schematic view of a driving device according to a seventh embodiment.

FIG. 12 is a schematic view of a driving device according to the seventh embodiment. The driving device 700 includes a motor 140 and an inverter circuit 150.

The inverter circuit 150 is configured with three semiconductor modules 150a, 150b, and 150c in which the vertical transistor 100 according to the first embodiment is used as a switching element. The three semiconductor modules 150a, 150b, and 150c are connected with each other in parallel, so that a three-phase inverter circuit 150 including three AC voltage output terminals U, V, and W is realized. The motor 140 is driven by the AC voltage output from the inverter circuit 150.

According to the seventh embodiment, the vertical transistor 100 with the improved characteristics is provided, so that the characteristics of the inverter circuit 150 and the driving device 700 are improved.

Eighth Embodiment

A vehicle according to an eighth embodiment is a vehicle provided with the semiconductor device according to the first embodiment.

Figure 13:
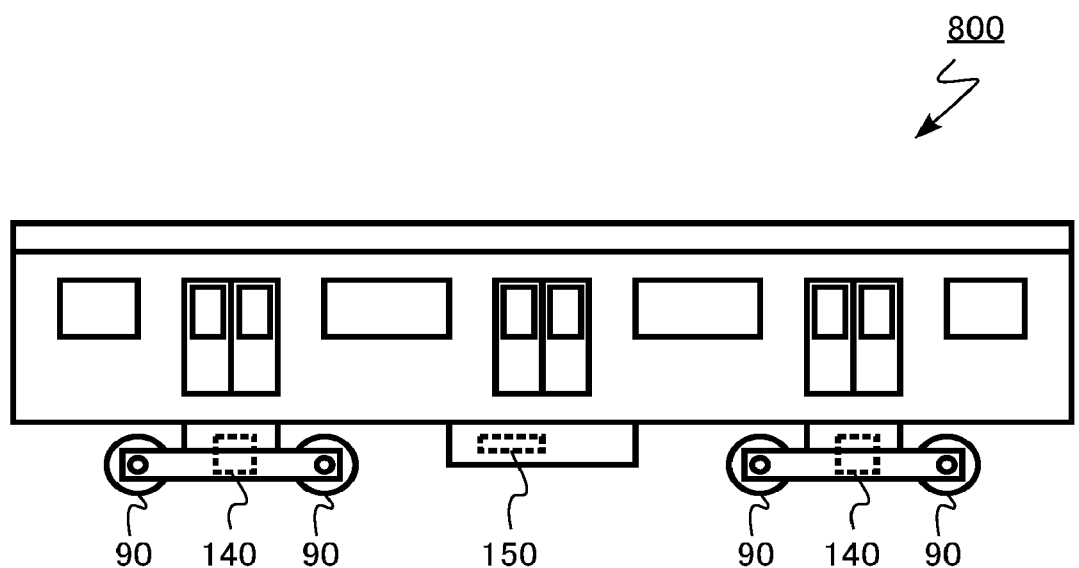
FIG. 13 is a schematic view of a vehicle according to an eighth embodiment.

FIG. 13 is a schematic view of a vehicle according to the eighth embodiment. The vehicle 800 according to the eighth embodiment is a railroad vehicle. The vehicle 800 includes a motor 140 and an inverter circuit 150.

The inverter circuit 150 is configured with three semiconductor modules in which the vertical transistor 100 according to the first embodiment is used as a switching element. The three semiconductor modules are connected with each other in parallel, so that a three-phase inverter circuit 150 including three AC voltage output terminals U, V, and W is realized. The motor 140 is driven by the AC voltage output from the inverter circuit 150. The wheel 90 of the vehicle 800 is rotated by the motor 140.

According to the eighth embodiment, the vertical transistor 100 with improved characteristics is provided, so that the characteristics of the vehicle 800 are improved.

Ninth Embodiment

A vehicle according to a ninth embodiment is a vehicle provided with the semiconductor device according to the first embodiment.

Figure 14:
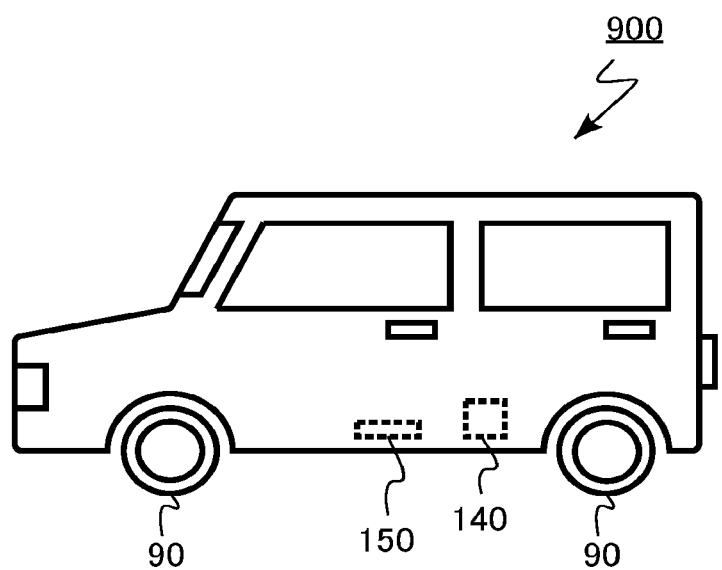
FIG. 14 is a schematic view of a vehicle according to a ninth embodiment.

FIG. 14 is a schematic view of the vehicle according to the ninth embodiment. The vehicle 900 according to the ninth embodiment is a car. The vehicle 900 includes a motor 140 and an inverter circuit 150.

The inverter circuit 150 is configured with three semiconductor modules in which the vertical transistor 100 according to the first embodiment is used as a switching element. The three semiconductor modules are connected with each other in parallel, so that a three-phase inverter circuit 150 including three AC voltage output terminals U, V, and W is realized.

The motor 140 is driven by the AC voltage output from the inverter circuit 150. The wheel 90 of the vehicle 900 is rotated by the motor 140.

According to the ninth embodiment, the vertical transistor 100 with improved characteristics is provided, so that the characteristics of the vehicle 900 are improved.

Tenth Embodiment

An elevator according to a tenth embodiment is an elevator provided with the semiconductor device according to the first embodiment.

Figure 15:
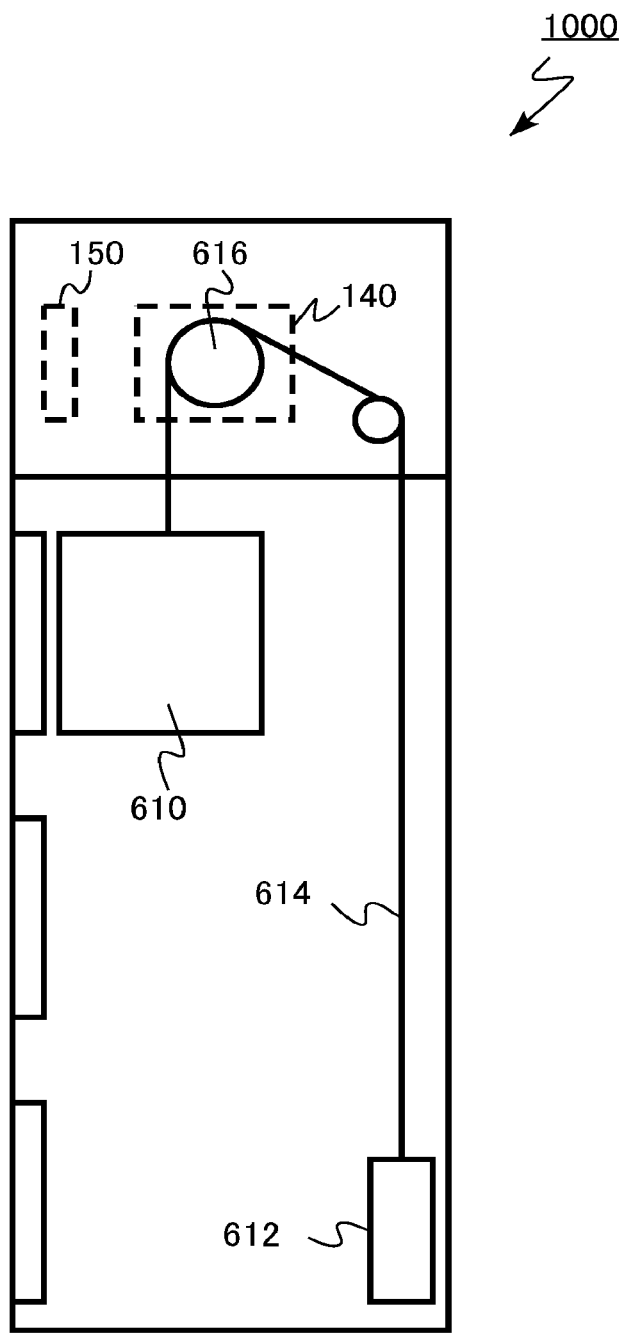
FIG. 15 is a schematic view of an elevator according to a tenth embodiment.

FIG. 15 is a schematic view of the elevator according to the tenth embodiment. The elevator 1000 according to the tenth embodiment includes a cage 610, a counterweight 612, a wire rope 614, a winding machine 616, a motor 140, and an inverter circuit 150.

The inverter circuit 150 is configured with three semiconductor modules in which the vertical transistor 100 according to the first embodiment is used as a switching element. The three semiconductor modules are connected with each other in parallel, so that a three-phase inverter circuit 150 including three AC voltage output terminals U, V, and W is realized.

The motor 140 is driven by the AC voltage output from the inverter circuit 150. The winding machine 616 is rotated by the motor 140, so that the cage 610 is lifted up and down.

According to the tenth embodiment, the vertical transistor 100 with the improved characteristics is provided, so that the characteristics of the elevator 1000 are improved.

As described above, in the first to sixth embodiments, a case where the silicon carbide has a crystal structure of 4H—SiC has been described as an example, but the embodiments can also be applied to a silicon carbide having the crystal structure of 6H—SiC.

In the first to sixth embodiments, a case where the gate insulating layer 18 is provided on the silicon face or themface of the silicon carbide has been described as an example, but the embodiments can also applied to a case where the aluminum nitride layer 16 is provided to other faces of, for example, an a-face, a (0-33-8)-face, and the like of the silicon carbide.

The embodiments can also be applied to n-channel insulated gate bipolar transistors (IGBTs).

In addition, the embodiments can be applied not only to an n-channel type transistor having electrons as carriers but also to a p-channel type transistor having holes as carriers. In a case where the embodiments are applied to a p-channel transistor, in order to form a two-dimensional hole gas, it is necessary to form the aluminum nitride layer 16 so that the c-axis direction of the aluminum nitride crystal in the aluminum nitride layer 16 is opposite to the c-axis direction of the silicon carbide layer 10.

In the seventh to tenth embodiments, a case where the semiconductor device according to the embodiments is applied to a vehicle or an elevator is described as an example, but the semiconductor device according to the embodiments can be applied to, for example, a power conditioner of a solar power generation system.

While certain embodiments have been described, these embodiments have been presented by way of example only, and are not intended to limit the scope of the inventions. Indeed, semiconductor devices, inverter circuits, driving devices, vehicles, and elevators described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a silicon carbide layer having a first plane and a second plane facing the first plane;
    a first silicon carbide region of a first conductivity type existing in the silicon carbide layer;
    a second silicon carbide region of a second conductivity type existing in the silicon carbide layer and being located between the first silicon carbide region and the first plane;
    a third silicon carbide region of the first conductivity type existing in the silicon carbide layer and being located between the second silicon carbide region and the first plane;
    a first electrode located on a side of the silicon carbide layer closer to the first plane;
    a second electrode located on a side of the silicon carbide layer closer to the second plane;
    a gate electrode;
    a crystalline aluminum nitride layer located between the second silicon carbide region and the gate electrode, the crystalline aluminum nitride layer being in direct contact with the second silicon carbide region; and
    an insulating layer located between the crystalline aluminum nitride layer and the gate electrode and having a wider band gap than the crystalline aluminum nitride layer,
    wherein a thickness of the crystalline aluminum nitride layer is larger than 30 nm.

2. The semiconductor device according to claim 1, wherein a face of the second silicon carbide region being in contact with the aluminum nitride layer is a plane inclined at an angle of 0 degrees to 10 degrees with respect to an m-face or a plane inclined at an angle of 0 degrees to 10 degrees with respect to an a-face.

3. The semiconductor device according to claim 1, wherein a thickness of the crystalline aluminum nitride layer is equal to or smaller than 60 nm.

4. The semiconductor device according to claim 1, wherein the second conductivity type impurity concentration of the second silicon carbide region is $5 \times 10^{17}$ cm$^{-3}$ or more.

5. The semiconductor device according to claim 1, wherein the second silicon carbide region includes a first portion and a second portion located between the first portion and the aluminum nitride layer, the second portion having a second conductivity type impurity concentration lower than a second conductivity type impurity concentration of the first portion.

6. The semiconductor device according to claim 1, wherein, in a case where the first conductivity type is n-type and the second conductivity type is p-type, an angle between a c-axis direction of the aluminum nitride crystal contained in the crystalline aluminum nitride layer and a direction from the second silicon carbide region toward the gate electrode is less than 90 degrees.

7. The semiconductor device according to claim 6, wherein the angle is 45 degrees or less.

8. The semiconductor device according to claim 1, wherein the crystalline aluminum nitride layer contains boron (B).

9. The semiconductor device according to claim 1, wherein the crystalline aluminum nitride layer contains at least one element selected from a group consisting of scandium (Sc), yttrium (Y), and lanthanides (La, Ce, Pr, Nd, Pm, Sm, Eu, Gd, Tb, Dy, Ho, Er, Tm, Yb, and Lu).

10. The semiconductor device according to claim 1, wherein a silicon oxide equivalent thickness of the insulating layer is larger than 10 nm and equal to or smaller than 50 nm.

11. The semiconductor device according to claim 1, wherein the insulating layer contains a silicon oxide.

12. The semiconductor device according to claim 1, wherein the silicon carbide layer has a trench, and wherein the gate electrode is located in the trench.

* * * * *